United States Patent [19]

Mogi et al.

[11] 4,079,420

[45] Mar. 14, 1978

[54] CHANNEL SELECTING APPARATUS

[75] Inventors: Takao Mogi, Tokyo; Hisao Okada, Yokohama, both of Japan

[73] Assignee: Sony Corporation, Tokyo, Japan

[21] Appl. No.: 743,008

[22] Filed: Nov. 18, 1976

[30] Foreign Application Priority Data

Nov. 22, 1975 Japan .............................. 50-140570

[51] Int. Cl.² .............................................. H04B 1/16
[52] U.S. Cl. .................................. 358/195; 325/420; 325/464; 334/16
[58] Field of Search ............... 325/418, 420, 421, 422, 325/423, 335, 453, 464, 468; 334/15, 16; 358/191, 195

[56] References Cited

U.S. PATENT DOCUMENTS

| 3,715,687 | 2/1973 | Solender | 325/453 |
| 3,968,440 | 7/1976 | Ehni | 325/464 |

Primary Examiner—Robert L. Griffin
Assistant Examiner—Marc E. Bookbinder
Attorney, Agent, or Firm—Lewis H. Eslinger; Alvin Sinderbrand

[57] ABSTRACT

In a channel selecting apparatus for a television receiver having an electronic tuning tuner for changing the receiving frequency in accordance with an analog control signal applied thereto; a memory has a plurality of addresses for storing respective digital codes each identifying a respective channel and which are selectively activated so as to effect read out of the respective channel identifying digital code to a digital-to-analog converter which converts the same into a respective analog control signal for the tuner. A deviation of the receiving frequency, as established in response to the analog control signal, from the correct receiving frequency for the channel identified by the digital code then being read out of the memory is detected, and, in response to a detected deviation within a pull-in range of an automatic fine tuning (AFT) circuit, the latter changes the digital code applied to the converter in the sense for removing such deviation and thereby achieving the correct tuned condition. Further, when the detected deviation is outside the pull-in range of the AFT circuit, sweeping changes are made in the digital code applied to the converter for cyclically varying the receiving frequency and thereby bringing the latter at least into the pull-in range of the AFT circuit. The modified digital code resulting from the operation of the AFT circuit and/or from the sweeping changes in such code is stored in the memory in place of the read out digital code resulting in such deviation.

17 Claims, 64 Drawing Figures

FIG.5
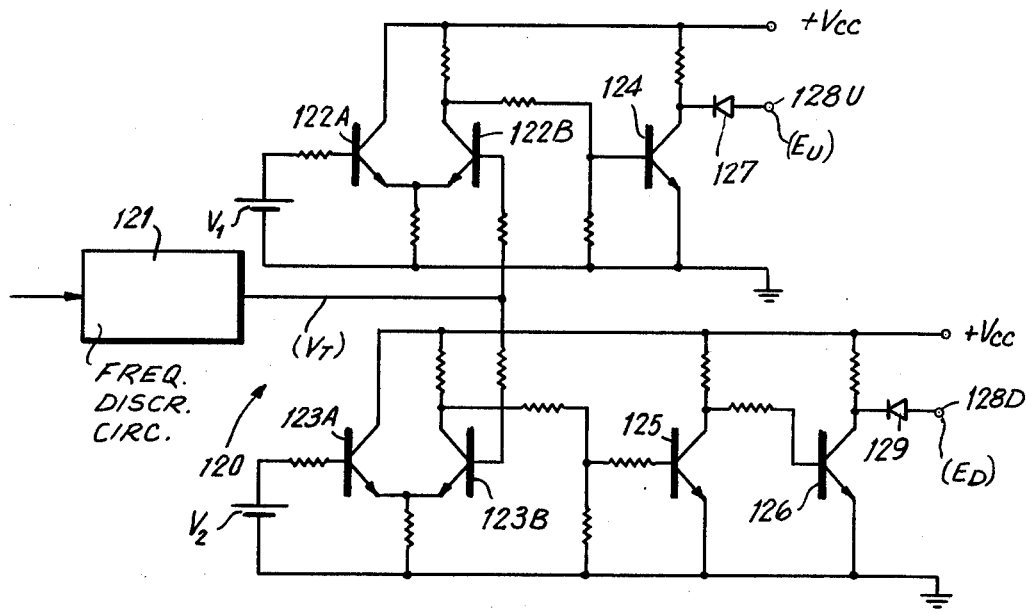
FIG.6A
FIG.6B
FIG.6C
FIG.6D
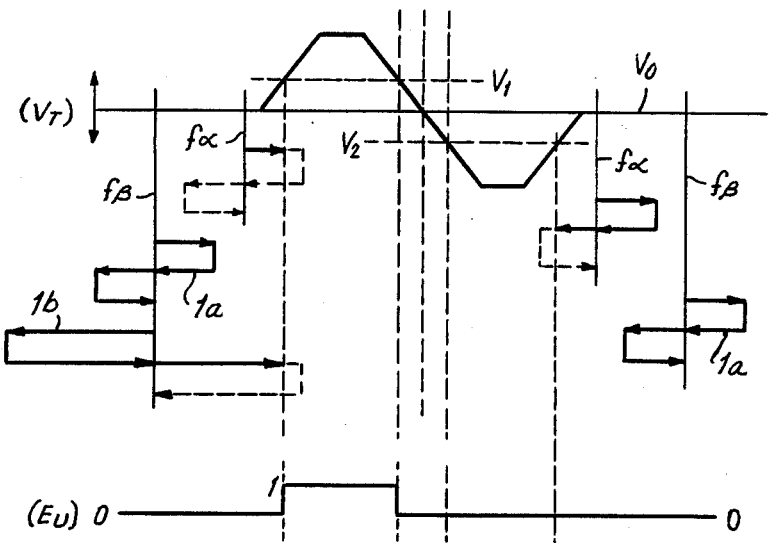
FIG.6E
FIG.6F
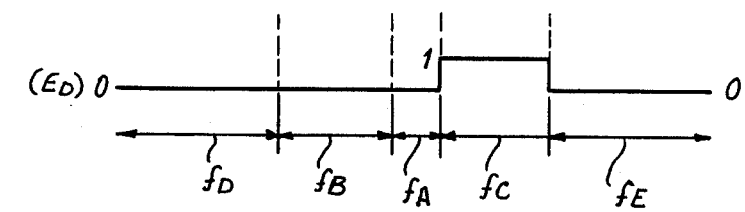

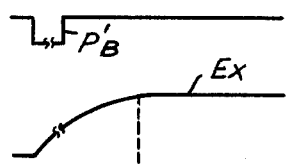
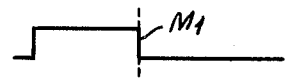
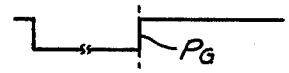
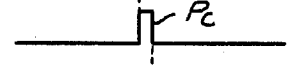
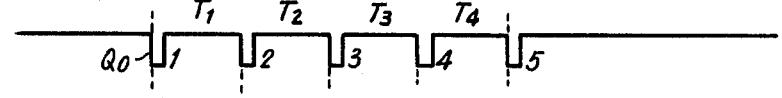
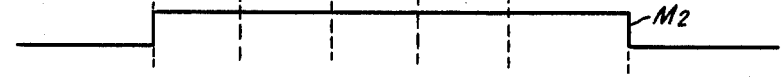
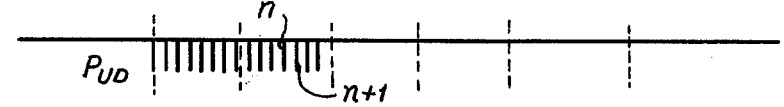
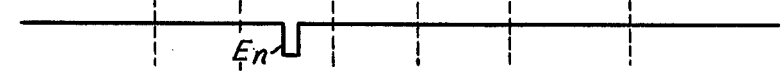
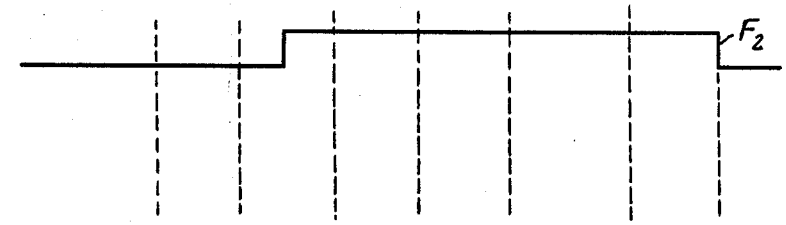

CHANNEL SELECTING APPARATUS

BACKGROUND OF THE INVENTION

1. Field of the Invention

This invention relates generally to channel selecting apparatus for a television receiver, and more particularly is directed to a channel selecting apparatus for a television receiver having a so-called electronic tuner employing, as its tuning element, a varactor or voltage-controlled, variable reactance device, such as, a variable capacitance diode.

2. Description of the Prior Art

Most existing television receivers employ electromechanical tuners in which a channel-selecting knob is manually rotatable through various positions established by a detent mechanism and which respectively correspond to the 12 vhf channels. At each of such positions of the knob, suitable switch contacts are engaged to activate a respective circuit by which the receiving frequency for the designated channel is obtained. Such electro-mechanical tuners are susceptible to failure because of loose or dirty switch contacts and defects in the detent mechanism. Furthermore, electromechanical tuners of the described type become extremely complex and even more unreliable when designed to tune the uhf channels in addition to the vhf channels.

In order to overcome the above problems of electro-mechanical tuners, so-called electronic tuners have been proposed for television receivers. In these proposed electronic tuners, a varactor, that is an analog voltage-controlled, variable reactance device, such as, a variable capacitance diode, is employed as the tuning element, and the control voltage therefor is usually obtained either by means of a potentiometer array or a phase-locked loop arrangement. In the case of the potentiometer array, a number of potentiometers are connected between a stable voltage supply and ground, and each potentiometer is adjusted to provide a voltage which, when applied to the varactor by way of a respective solid state switch, will tune the receiver to a respective one of the local channels. Further, manually operable switches are provided to control the solid state switches associated with the several potentiometers. In the foregoing arrangement, it is difficult and costly to obtain stable potentiometers, and rather elaborate mechanical assemblies are required to provide for the adjustment of the several potentiometers so as to correspond to respective local channels.

In the existing electronic tuners employing a varactor with a phase-locked loop, the variable frequency output of the varactor controlled tuner is applied through an amplifier to a prescaler which divides such output frequency by a fixed number, and the resulting divided frequency is then further divided, in a variable counter or divider, by a number that is determined by a preset logic controlled by manually operable channel-selector switches. The output of the variable counter or divider is then compared, in a phase comparator, with a stable reference frequency obtained, for example, from a crystal-controlled oscillator, with the resulting error signal being used to control or vary the control voltage for the varactor. The foregoing phase-locked loop arrangement is disadvantageous in that the amplifier used to raise the low level of the output of the tuner for driving the digital prescaler may be costly, and further in that such prescaler has to operate at an undesirably high input frequency.

The present inventors have developed a channel selecting apparatus for a television receiver having a tuner with a voltage-controlled variable reactance device as its tuning element and which avoids the above described problems, for example, as disclosed in U.S. patent application Ser. No. 716,702, filed Aug. 23, 1976, and corresponding to Japanese Patent Application No. 103,668/75, filed Aug. 27, 1975. In such channel selecting apparatus, digital or binary codes representing or identifying respective channels are stored at respective addresses in a memory, and a digital-to-analog converter provides an analog control voltage for the variable reactance device in correspondence to each digital code selectively read out of the memory in a channel selecting mode of the apparatus. Further, in a programming mode of the apparatus, the changing digitally coded counts of a counter which is counting sweep pulses are applied to the digital-to-analog converter for similarly controlling the variable reactance device and selected counts of the counter, for example, those which result in the appearance on the receiver screen of pictures or test patterns broadcast by selected television stations or channels, are written at selected addresses in the memory as the channel identifying codes. Although the foregoing channel selecting apparatus is provided with a sweep pulse generating circuit which is manually controllable to provide either coarse or fine sweep pulses to be counted in the programming mode for establishing the channel identifying codes to be written or stored at selected addresses of the memory, the selection of each channel identifying code to be stored is made by visually observing the picture or image appearing on the screen of the television receiver and, therefore, the stored code may not be the optimum code for obtaining precise tuning to the respective channel.

In order to overcome the last mentioned problem, the present inventors, with another, have provided a channel selecting apparatus, as aforesaid, with an automatic fine tuning operation, for example, as disclosed in U.S. patent application Ser. No. 716,655, filed Aug. 23, 1976, and corresponding to Japanese Patent Applications No. 104,445/75, filed Aug. 28, 1975, and No. 104,556/75, filed Aug. 29, 1975. In such channel selecting apparatus, there are provided means for detecting deviation of the receiving frequency, as established in response to the analog control signal, from the correct receiving frequency for the channel identified by the digital code then being read out of the memory, and means responsive to a detected deviation of the established receiving frequency from the correct receivimg frequency for modifying the digital code then being received by the digital-to-anlog converter in the sense for removing said deviation, whereby to effect an automatic fine tuning operation. Further, the channel selecting apparatus is preferably provided with means operative, when the detected deviation of the established receiving frequency from the correct receiving frequency exceeds a predetermined amount, to store the resulting modified digital code in the memory in place of the read out digital code resulting in such deviation with a view to ensuring that the receiving frequency established at any time in response to a channel identifying code read out of the memory will remain within the pull-in range of the automatic fine tuning operation. Thus, the described channel selecting apparatus seeks to reliably achieve the automatic fine tuning operation even though the relation of the control voltage for the variable reactance device to the resulting receiving frequency may vary with temperature or the time of year. However, the automatic fine tuning in respect to each channel identified by a digital code stored in the memory is reliably achieved only if each such channel is regularly selected. In other words, if one or more of the channels programmed in the memory is infrequently selected, the change in the relation of the control voltage for the variable reactance device to the resulting receiving frequency may be so large during the extended time period between successive selections of such channel as to cause the receiving frequency established by the respective channel identifying code read out of the memory to be outside the pull-in range of the automatic fine tuning operation.

OBJECTS AND SUMMARY OF THE INVENTION

Accordingly, it is an object of this invention to provide an improved channel selecting apparatus for a television receiver having a tuner with a varactor or voltage-controlled variable reactance device as its tuning element, and in which the above described problems and disadvantages of the previously proposed channel selecting apparatus for electronic tuners are avoided.

More particularly, it is an object of this invention to provide a channel selecting apparatus, as aforesaid, which can be easily and inexpensively formed as an integrated circuit, and which is capable of tuning the associated television receiver to any desired channel with very high accuracy and reliability.

Another object is to provide a channel selecting apparatus, as aforesaid, which is devoid of any potentiometers or variable resistors for establishing the control voltage of the varactor, thereby to avoid the problems that may arise from the high contact resistance or changes in the resistance value of potentiometers that can occur due to vibration, temperature variations or simply with time.

Still another object is to provide a channel selecting apparatus, as aforesaid, which may be very simply and quickly preset or programmed for determining the local channels that are to be received.

A further object is to provide a channel selecting apparatus, as aforesaid, with an automatic fine tuning operation.

A still further object is to provide a channel selecting apparatus, as aforesaid, in which the automatic fine tuning operation is reliably achieved even though the relation of the control voltage for the variable reactance device to the resulting receiving frequency may vary with temperature or the time of year, and even though one or more of the local channels preset or programmed in the apparatus may be infrequently or rarely selected.

In accordance with an aspect of this invention, in a channel selecting apparatus for a television receiver having an electronic tuning tuner for changing the receiving frequency in accordance with an analog control signal applied thereto and being provided with a memory having a plurality of addresses for storing respective digital codes each identifying a respective channel, addressing means for selectively activating each of the addresses in the memory so as to effect read out of the respective channel identifying digital code, and a digital-to-analog converter receiving the digital code being read out of the memory for converting the same into a respective analog control signal for the tuner; there are further provided an automatic fine tuning (AFT) circuit which detects deviation of the receiving frequency, as established in response to the analog control signal, from the correct receiving frequency for the channel identified by the digital code then being read out of the memory and, in response to a detected deviation within a predetermined pull-in range, is effective to modify the digital code being received by the digital-to-analog converter in the sense for removing such deviation, and means detecting a deviation of the receiving frequency outside the pull-in range of the AFT circuit and, in response thereto, causing sweeping changes in the digital code being received by the digital-to-analog converter so as to cyclically vary the receiving frequency and in the course thereof, bring the receiving frequency into the pull-in range for the AFT circuit so that the latter can then pull-in the actual receiving frequency to the correct receiving frequency for the selected channel.

Further, the channel selecting apparatus according to this invention, as described above, is preferably provided with rewriting means operative, when the AFT circuit corrects a deviation of the established receiving frequency from the correct receiving frequency that exceeds a predetermined amount, to store or rewrite the resulting modified digital code in the memory in place of the read out digital code resulting in said deviation so that the receiving frequency thereafter established in response to activation of the respective memory address will correspond to the modified or rewritten digital code.

In a preferred embodiment of the invention, a relatively narrow sweeping change is effected in the digital code received by the digital-to-analog converter following commencement of operation of the channel selecting apparatus and following each selective actuation of a memory address so as to minimize the resulting disturbance of the television receiver picture and, in the event that such narrow sweeping change in the digital code is not sufficient to bring the receiving frequency into the pull-in range for the AFT circuit, a relatively wide sweeping change is effected in the digital code received by the digital-to-analog converter to bring the resulting receiving frequency into the pull-in range, whereupon the modified digital code for establishing the correct receiving frequency is rewritten or stored in the memory in place of the channel identifying code which resulted in the large deviation of the established receiving frequency from the correct receiving frequency.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 5 is a wiring diagram showing a portion of an automatic fine tuning (AFT) circuit that is included in the apparatus according to this invention;

FIGS. 6A–6F are waveform diagrams to which reference will be made in explaining the operation of the channel selecting apparatus of FIG. 1;

FIGS. 9A–9Z and FIGS. 10A–10U are waveform diagrams to which reference will be made in describing the operations of the circuits of FIGS. 7 and 8, respectively.

DESCRIPTION OF A PREFERRED EMBODIMENT

Figure 1:
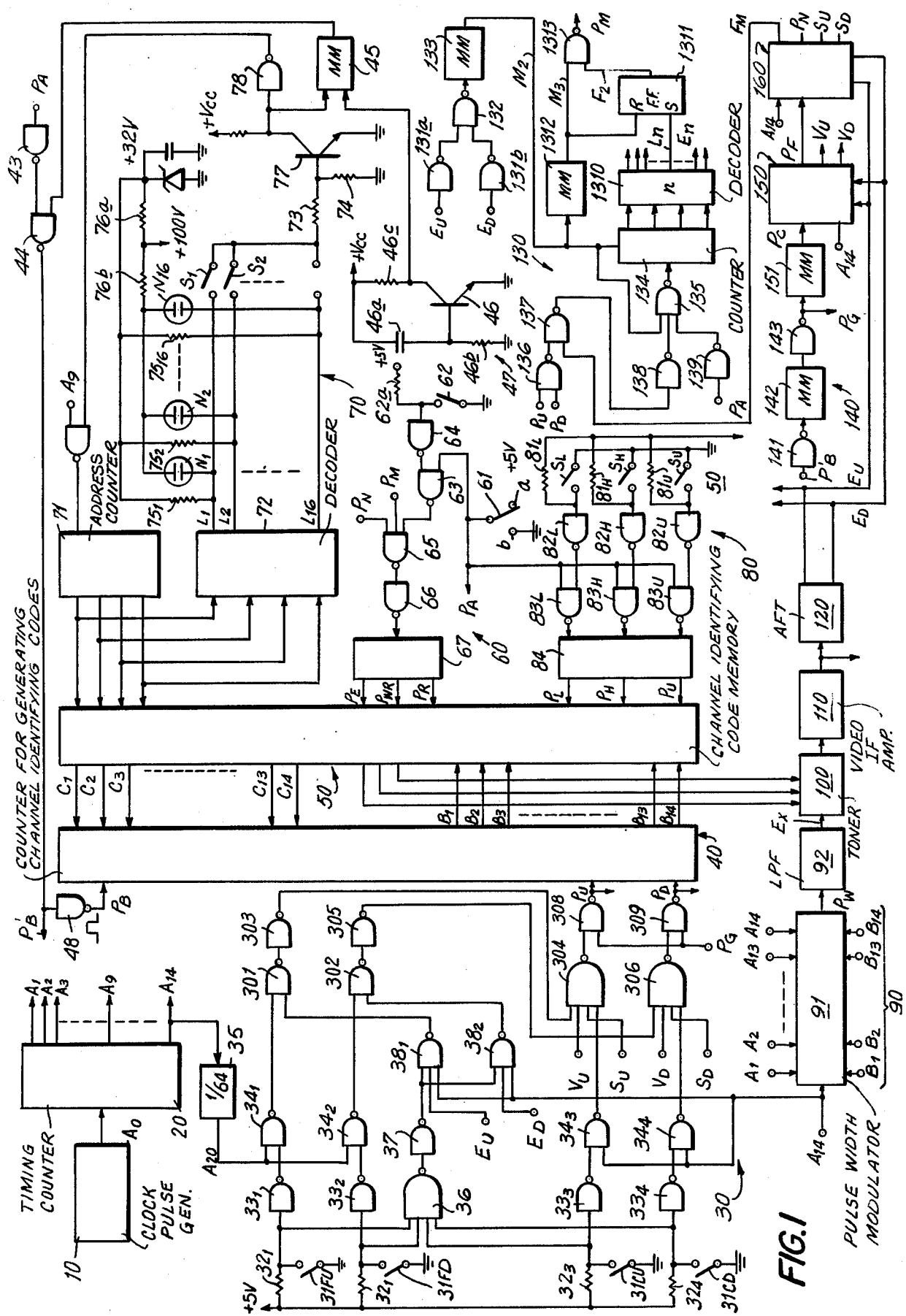
FIG. 1 is a block diagram illustrating a channel selecting apparatus according to an embodiment of this invention.

Referring to the drawings in detail, and initially to FIG. 1 thereof, it will be seen that a channel selecting apparatus to which this invention is applied generally comprises a generator 10 of a clock pulse $A_o$ which is applied to a timing counter 20 for producing a circulating digital or binary code $A_1, A_2, A_3 \ldots A_{14}$; a sweep pulse generating circuit 30 which is manually controllable to selectively produce up-sweep pulses $P_U$ or down-sweep pulses $P_D$; and an up-down counter 40 which, in a programming mode of the apparatus, counts the sweep pulses $P_U$ or $P_D$ to establish channel identifying digital codes $B_1, B_2, B_3 \ldots B_{14}$ corresponding to the changing counts of counter 40 and which may be selectively written at selected addresses in a memory 50. Further, the illustrated channel selecting apparatus generally comprises a memory control circuit 60 for selectively establishing the previously mentioned programming mode of operation or a channel selecting mode of operation in which a channel identifying digital code previously written or stored at a selected address in memory 50 is read out therefrom, as indicated at $C_1, C_2, C_3 \ldots C_{14}$, with such read out code being applied to counter 40 for establishing the corresponding count in the latter; an address selecting circuit 70 that is manually controllable for activating a selected address in memory 50 for either the writing of a selected channel identifying code at such address or the reading out of a previously stored channel identifying code from the selected address during the programming or channel selecting modes, respectively, and a band indicating signal forming circuit 80 which, in the programming mode of operation, is selectively operable to produce a signal indicating the band of the channel indicating code then being written or stored at a selected address of memory 50, with such band indicating signal being also written or stored at the respective address. The channel selecting apparatus shown on FIG. 1 also generally comprises a digital-to-analog converter 90 which provides an analog control voltage for the varactor of a selected band in an electronic tuner 100 in correspondence to the count of counter 40 established by a channel identifying digital code selectively read out of memory 50 in a channel selecting mode of the apparatus, or in correspondence to the changing counts of counter 40 produced when the latter counts sweep pulses from generating circuit 30 in the programming mode of the apparatus; and a video intermediate frequency amplifier 110 which receives the tuned frequency output of tuner 100 and has its output applied to a conventional video detector circuit (not shown) as in the usual color television receiver.

The output of video intermediate frequency amplifier 110 is also shown to be applied to an automatic fine tuning (AFT) circuit 120 which frequency-discriminates a video carrier wave in the output of IF amplifier 110 and produces a corresponding AFT voltage $V_T$ from which discriminated outputs $E_U$ and $E_D$ are selectively derived, as hereinafter described in detail, so as to indicate that the channel identifying code then being applied to converter 90 for establishing a receiving frequency in the channel selecting mode of the apparatus has to be modified upwardly or downwardly, respectively, for attaining precisely the correct receiving frequency for the respective channel. The discriminated outputs $E_U$ and $E_D$ are applied to sweep pulse generating circuit 30 which, as hereinafter described in detail, responds to the discriminated output $E_U$ or $E_D$ to provide sweep pulses which are counted by counter 40 for modifying the channel identifying code applied therefrom to converter 90 in the direction to obtain precisely the correct receiving frequency, that is, for achieving the desired AFT operation.

Further, a memory rewriting circuit 130 is provided in the channel selecting apparatus and, as hereinafter described in detail, is operative, when the extent to which the channel identifying code being read out of a selected address in memory 50 to counter 40 has to be modified for obtaining the correct receiving frequency for the respective channel exceeds a predetermined amount, to cause the writing of the modified channel identifying code at the selected address in place of the code originally stored thereat. The illustrated channel selecting apparatus is also shown to comprise an AFT inhibit circuit 140 which is effective, as hereinafter described in detail, to prevent the AFT operation during the initial application of power to the apparatus and during operation of the address selecting circuit 70.

Figure 4:
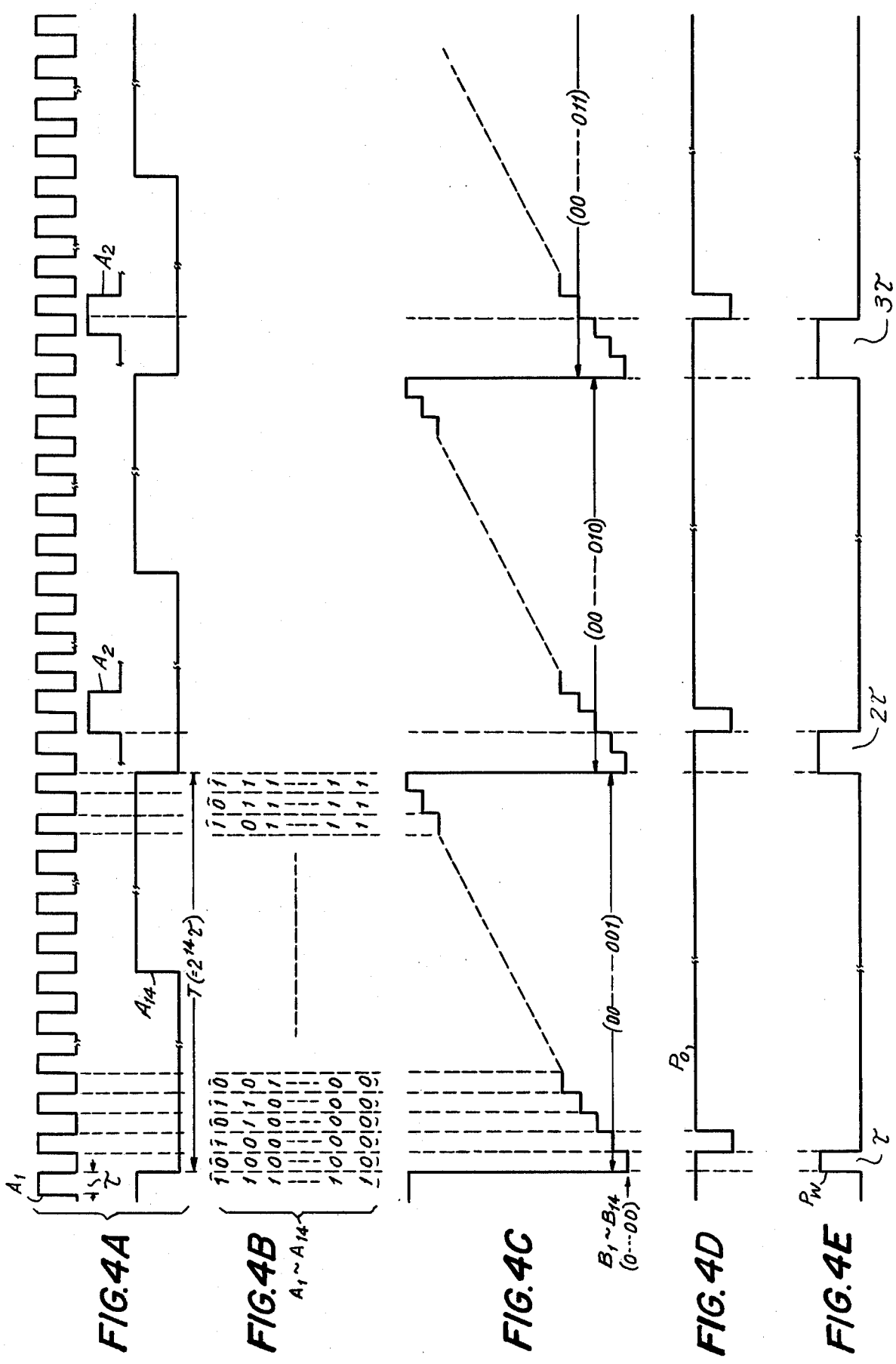
FIGS. 4A–4E are waveform diagrams to which reference will be made in explaining the operation of the channel selecting apparatus of FIG. 1.

In the channel selecting apparatus as generally described above, the clock pulse $A_o$ from generator 10 may have a frequency of, for example, 4 MHz resulting in a period $\tau$ of 0.25 $\mu$ sec. In the timing counter 20, such clock pulse $A_o$ is counted to produce pulses $A_1, A_2, A_3 \ldots A_{14}$ which are frequency-divided in sequence so as to range from the pulses $A_1$ having a period of 0.5 $\mu$ sec. and a pulse width of 0.25 $\mu$ sec., to the pulses $A_{14}$ having a period of 4.096 m.sec. and a pulse width of 2.048 m.sec., thereby to form a 14-bit circulating digital code constituted by the pulses $A_1, A_2, A_3 \ldots A_{14}$. It will be apparent that such 14-bit circulating digital code changes its state $2^{14}$ times, that is, 16,384 times, within the circulating or repeating period of $T = 2^{14} \tau = 4.096$ m.sec. (FIGS. 4A and B).

In the sweep pulse generating circuit 30 as shown on FIG. 1, a fine up-sweep switch 31FU, a fine down-sweep switch 31FD, a coarse up-sweep switch 31CU and a coarse down-sweep switch 31CD are connected in series circuits with respective resistors $32_1, 32_2, 32_3$ and $32_4$, and such series circuits are connected in parallel between a voltage source +5V and ground. The switches 31FU, 31FD, 31CU and 31CD are normally open, as shown, to provide signals at the relatively high level "1" at the junctions of such switches with the respective resistors $32_1, 32_2, 32_3$ and $32_4$. Further, the switches 31FU, 31FD, 31CU and 31CD are adapted to be selectively manually displaced to the closed condition thereof for providing a signal at the low level "0" at the junction of the closed switch with the respective resistor $32_1$-$32_4$. Such signals "1" or "0" from switches 31FU, 31FD, 31CU and 31CD are applied through inverters $33_1, 33_2, 33_3$ and $33_4$ to first inputs of NAND circuits $34_1, 34_2, 34_3$ and $34_4$, respectively. The pulses $A_{14}$ having a period of 4.096 m.sec. are applied from timing counter 20, as coarse sweep pulses, to second inputs of NAND circuits $34_3$ and $34_4$. Further, the pulses $A_{14}$ from timing counter 20 are applied to a frequency divider 35 so as to be divided in the latter, for example, by 64, for providing fine sweep pulses having a period of 262.144 m.sec. and such fine sweep pulses are applied to second inputs of NAND circuits $34_1$ and $34_2$.

The signals "1" or "0" from switches 31FU, 31FD, 31CU and 31CD are also all applied to a NAND circuit 36 which has its output connected to an inverter 37 to provide an inverted output which is, in turn, applied to NAND circuits $38_1$ and $38_2$. The NAND circuits $38_1$ and $38_2$ also have applied thereto the pulses $A_{14}$ from timing counter 20, and the discriminated outputs $E_U$ and $E_D$, respectively, from AFT circuit 120. The outputs of NAND circuits $34_1$ and $38_1$ are applied to a NAND circuit 301, while the outputs of NAND circuits $34_2$ and $38_2$ are similarly applied to a NAND circuit 302. The output of NAND circuit 301 is applied through an inverter 303 to a NAND circuit 304 which also receives the output of NAND circuit $34_3$, and the output of NAND circuit 302 is similarly applied through an inverter 305 to a NAND circuit 306 which also receives the output of NAND circuit $34_4$. The outputs of NAND circuits 304 and 306 are respectively applied to NAND circuits 308 and 309 which each also receive an AFT inhibit pulse $P_G$ from circuit 140, and the outputs of NAND circuits 308 and 309 are applied as up-sweep pulses $P_U$ and down-sweep pulses $P_D$, respectively, to counter 40.

Figure 2:
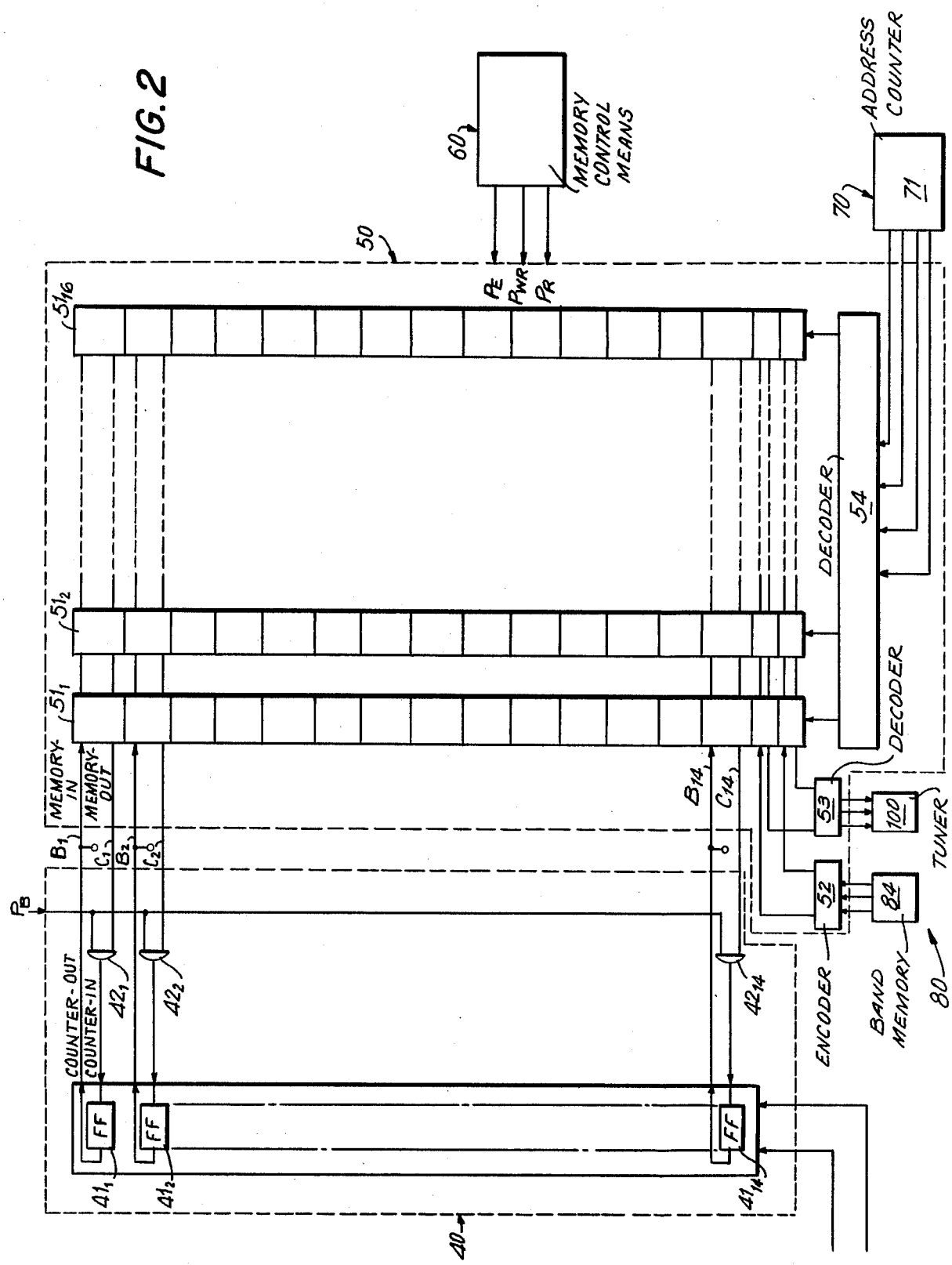
FIG. 2 is a block diagram illustrating, in greater detail, an up-down counter for generating channel identifying codes and a memory which are included in the apparatus of FIG. 1.

As shown schematically on FIG. 2, the counter 40 may be a conventional 14-bit up-down counter havng 14 flip-flops $41_1, 41_2 \ldots 41_{14}$ which have their states changed sequentially in the up or down direction when counting the up-sweep pulses $P_U$ or the down-sweep pulses $P_D$, respectively, to establish the respective bits of sequentially changing 14-bit channel identifying codes $B_1, B_2 \ldots B_{14}$. It is to be noted that the count of counter 40, that is, the 14-bit channel identifying code established thereby, remains unchanged in the event that up-sweep pulses $P_U$ and down-sweep pulses $P_D$ are simultaneously applied to the counter. In the programming mode of operation, the channel identifying codes are applied from counter 40 to memory 50 for writing or storage of a selected one of such codes at a selectively activated address in the memory, and the sequentially changing channel identifying codes are also applied from counter 40 to digital-to-analog converter 90 for providing a correspondingly varied control voltage for the varactor in a selected band of electronic tuner 100. The flip-flops $41_1$-$41_{14}$ of counter 40 are further adapted, in the channel selecting mode of operation, to have their respective states established by the respective bits $C_1$-$C_{14}$ of a memorized channel identifying code which are read out of a selectively activated address in memory 50 to AND circuits $42_1$-$42_{14}$ which also receive a load pulse $P_B$ during the channel selecting operation for passing the bits read out of the memory, as hereinafter described in detail, and which have their outputs respectively connected to flip-flops $41_1$-$41_{14}$.

As also shown on FIG. 2, the memory 50 may be desirably comprised of 16 memory units $51_1, 51_2 \ldots 51_{16}$ at respective addresses in memory 50, with the memory unit at each address being capable of storing 16-bits of digital information that is, the 14-bits of a selected channel identifying code from counter 40 and 2-bits from an encoder 52 for the band indicating signal received from circuit 80 for indicating whether the channel identified by the 14-bit digital code being stored at the respective address is a vhf or uhf channel, and, if it is a vhf channel, whether it is a low channel or a high channel in such broadcast band, respectively. Further, the memory 50 is schematically shown to include a decoder 53 which, in the programming and channel selecting modes of operation, receives the 2-bits of digital information representing the band of the channels identified by the 14-bit codes being applied to, or read out from, respectively, the memory units for providing a corresponding band identifying signal applied to electronic tuner 100 for selecting the corresponding band of the latter. Finally, the memory 50 is schematically shown to include a decoder 54 which receives a 4-bit digital code from the address selecting circuit 70, as hereinafter described in detail, and which is effective to activate or address the corresponding one of the memory units $51_1, 51_2 \ldots 51_{16}$. Preferably, the memory units of memory 50 are composed of non-volatile cells, such as, metal-nitride-oxide-silicon (MNOS) elements, so that the contents thereof, while being electrically alterable, are held unchanged during periods when memory 50 is disconnected from a source of power.

Returning again to FIG. 1, it will be seen that the memory control 60 includes a mode change-over switch 61 having a movable contact that is manually actuable to selectively engage fixed contacts $a$ and $b$. The fixed contact $a$ is connected to a voltage source +5V so that, when the movable contact of switch 61 engages fixed contact $a$ to establish the programming mode of operation, a signal $P_A$ at the relatively high level "1" is obtained from switch 61. On the other hand, the fixed contact $b$ of switch 61 is connected to ground so that, when the movable contact of switch 61 is engaged with fixed contact $b$ for establishing the channel selecting mode of operation, the signal $P_A$ is at the relatively low level "0". Memory control 60 is further shown to have a normally open switch 62 which is connected in series with a resistor 62a between a voltage source +5V and ground. The signal $P_A$ from mode change-over switch 61 is shown to be applied to one input of a NAND circuit 63 which has another input connected through an inverter 64 with a junction in the connection between switch 62 and resistor 62a. It will be apparent that, when switch 62 is in its normally open position, as shown, the output of inverter 64 will be at the low level "0", whereas, when switch 62 is manually closed to effect a writing operation with the apparatus in its programming mode, the output of inverter 64 will be at the relatively high level "1". The output of NAND circuit 63 is shown to be applied to a NAND circuit 65 along with a rewrite instruction signal PM from circuit 130, and the output of NAND circuit 65 is applied through an inverter 66 to an instruction signal forming circuit 67. When the output of NAND circuit 63 or the instruction signal $P_M$ is at the low level "0", circuit 67 supplies an erasing pulse $P_E$ and then a writing pulse $P_{WR}$ to the memory unit at a selected address in memory 50 so as to erase the previously stored contents in such memory unit and, thereafter, to write in the selected memory unit the 14-bit channel identifying code then being received from counter 40 and the 2-bit code which represents the band of the channel identified by the code being written in the respective memory unit. On the other hand, when the output of NAND circuit 63 or the instruction signal $P_M$ is at the high level "1", instruction signal forming circuit 67 applies a read pulse $P_T$ to memory unit 50 so as to effect the read out of the contents stored in the memory unit which is then selected.

The band indicating signal forming circuit 80 is shown to include normally open switches $S_L, S_H$ and $S_U$ which are connected in series with respective resistors $81_L, 81_H$ and $81_U$ between a voltage source +5V and ground. Junctions between switches $S_L, S_H$ and $S_U$ and the respective resistors are connected to inverters $82_L, 82_H$ and $82_U$, respectively which have their outputs connected to first inputs of NAND circuits $83_L, 83_H$ and $83_U$, respectively, while the second inputs of such NAND circuits receive the signal $P_A$ from mode change-over switch 61. The outputs of NAND circuits $83_L, 83_H$ and $83_U$ are applied to a band memory 84 which is effective to apply a band indicating signal $P_L, P_H$ or $P_U$ to encoder 52 in memory 50 in response to a low level or "0" output from the NAND circuit $83_L, 83_H$ or $83_U$, respectively. It will be apparent that, in the programming mode of operation established by engagement of switch 61 with its fixed contact $a$ to provide the signal $P_A$ with the high value "1", the output of the NAND circuit $83_L, 83_H$ or $83_U$ has the low value "0" only when the respective switch $S_L, S_H$ or $S_U$ is manually closed for indicating that the channel identified by the 14-bit code to be written at a selected address in memory 50 is a low vhf channel, a high vhf channel or a uhf channel, respectively.

The address selecting circuit 70 of the illustrated channel selecting apparatus includes 16 normally open address selecting switches S,S . . . S which are each selectively manually actuable to the closed condition for selecting a corresponding one of the 16 addresses or memory units in memory 50 to be activated during a programming operation or channel selecting operation of the apparatus. The address selecting circuit 70 is further shown to include neon tubes or other indicators $N_1, N_2 \ldots N_{16}$ corresponding to the switches $S_1, S_2 \ldots S_{16}$, and an address counter 71 which, in response to the closing of a selected one of the switches $S_1 - S_{16}$, produces a corresponding 4-bit addressing code applied to the decoder 54 in memory 50 for addressing the corresponding memory unit in the latter, and a decoder 72 which receives the coded output of address counter 71 and, in response thereto, provides a "0" output signal on a respective one of 16 output lines $L_1, L_2 \ldots L_{16}$. The switches $S_1 - S_{16}$ are connected, at one side, in common, through series resistors 73 and 74 to ground, while the opposite sides of switches $S_1 - S_{16}$ are connected to lines $L_1 - L_{16}$, respectively. Further, the lines $L_1 - L_{16}$ are connected through resistors $75_1 - 75_{16}$, respectively, and a common resistor $76a$ with a voltage source +100V, while the neon tubes or indicators $N_1 - N_{16}$ are connected between the lines $L_1 - L_{16}$, respectively, and the same voltage source +100V through a common resistor $76b$. The junction between series-connected resistors 73 and 74 is connected to the base electrode of a switching transistor 77 having its emitter electrode connected to ground and its collector electrode connected to a voltage source $+V_{cc}$ and to an inverter 78. The output of inverter 78 is connected to one input of a NAND circuit 79 which, at its other input, receives the pulses $A_9$ produced by timing counter 20 and having a period of 0.128 m.sec. Finally, the output of NAND circuit 79 is applied to address counter 71 which is operative to count each "0" output of NAND circuit 79.

In order to provide the load pulse $P_B$ to AND circuits $42_1 - 42_{14}$ of counter 40 for read out to the latter of the channel identifying code $C_1 - C_{14}$ stored in a selected memory unit of memory 50 in the channel selecting mode of operation, the illustrated apparatus is further shown to include an inverter 43 receiving the signal $P_A$ from memory control 60 and having its output connected to one of the inputs of a NAND circuit 44 which, at its other input, is connected to the output of a monostable multivibrator 45 triggered by a relatively high collector output "1" from transistor 77 or from a transistor 46 of a time constant circuit 47. The output of NAND circuit 44 is connected to an inverter 48 which, in turn, has its output connected to AND circuits $42_1 - 42_{14}$ of counter 40 so that the positive load pulse $P_B$ is produced in response to a negative pulse $P'_B$ provided when the output of NAND circuit 44 is "0", that is, when signal $P_A$ has the value "0" for the channel selecting mode of operation and monostable multivibrator 45 is triggered to produce a pulse having the value "1" for a predetermined period of, for example, 50 m.sec. In the time constant circuit 47, the base electrode of transistor 46 is shown to be connected between a capacitor $46a$ and a resistor $46b$ which are connected, in series, between the voltage source $+V_{cc}$ and ground, while the collector of transistor 46 is connected through a resistor $46c$ with the voltage source and the emitter electrode of transistor 46 is connected to ground. Therefore, when the apparatus is initially connected to a power source, transistor 46 is made conductive and, hence its collector output is "0". After a predetermined lapse of time, for example, of 50 m.sec., transistor 46 is turned off so that its collector output rises to the value "1" for triggering monostable multivibrator 45 which then provides its output for the predetermined time of 50 m.sec.

In the channel selecting apparatus according to this invention, the digital-to-analog converter 90 preferably includes a pulse-width modulator 91 operative to produce a chain of pulses at a predetermined repetition rate with the width of each of such pulses being dependent on the channel identifying code $B_1, B_2 \ldots B_{14}$ obtained from counter 40 either in response to the counting by the latter of the sweep pulses from generating circuit 30 or in response to the read out of a channel identifying code stored at a selected address in memory 50, and a low pass filter 92 which receives the chain of pulses from modulator 91 for providing the analog control voltage for a varactor of electronic tuner 100 in dependence on the modulated width of the pulses. More particularly, the pulse-width modulator 91 determines the pulse width of the chain of pulses applied to low pass filter 92 in dependence on the absence of coincidence between the channel identifying code $B_1, B_2 \ldots B_{14}$ obtained from counter 40 and the circulating digital code $A_1, A_2 \ldots A_{14}$ applied to modulator 91 from timing counter 20.

Figure 3:
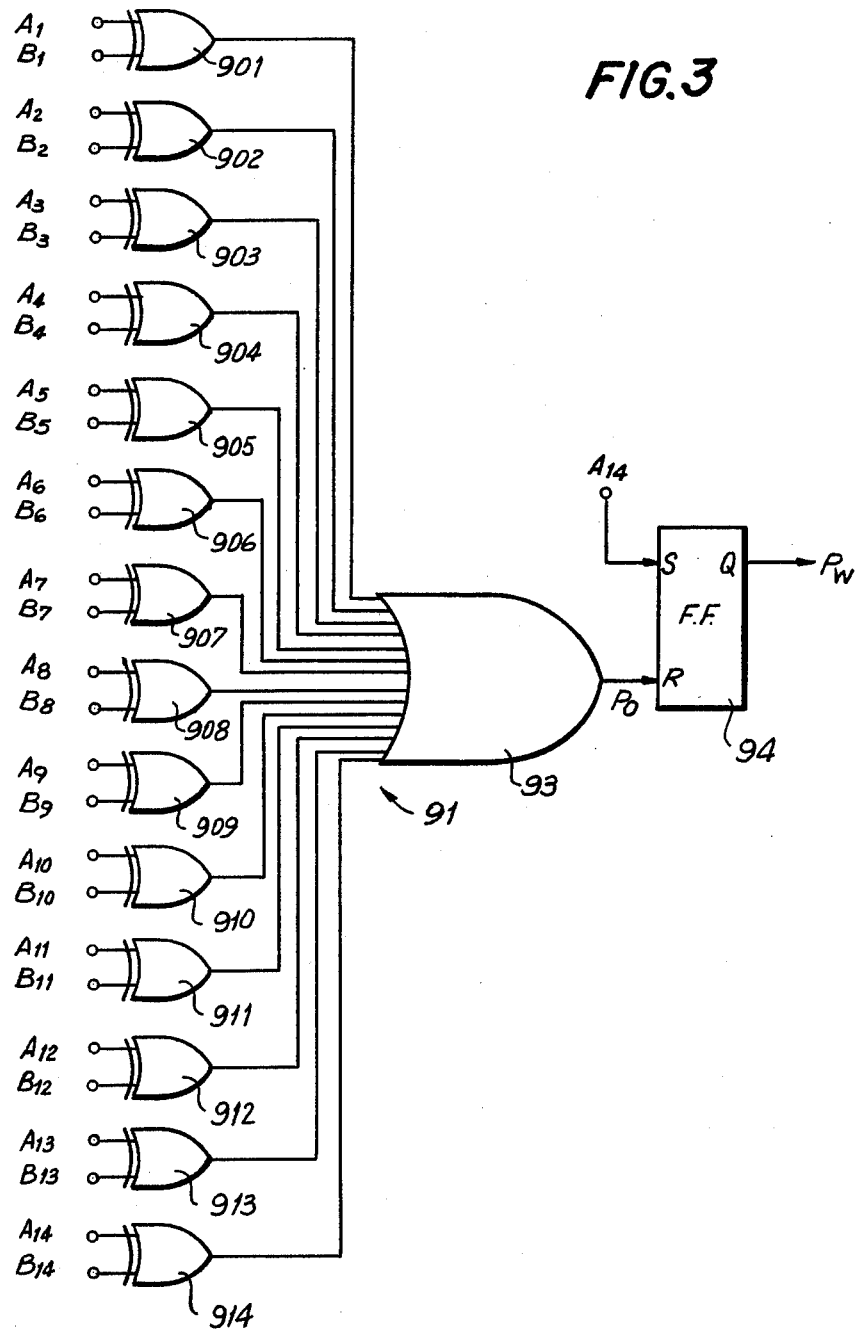
FIG. 3 is a detail block diagram of a pulse-width modulator which is included in the apparatus shown on FIG. 1.

As shown on FIG. 3, the pulse-width modulator 90 may advantageously include 14 exclusive OR circuits $901, 902 \ldots 914$ having first and second inputs which respectively receive the bits or pulses $A_1, A_2 \ldots A_{14}$ of the circulating code and the bits $B_1,B_2 \ldots B_{14}$ of the channel identifying code. The outputs of all of the exclusive OR ciruits 901–914 are applied through an OR circuit 93 to the reset terminal R of a flip-flop 94 which has the pulse $A_{14}$ with a period of 4.096 m.sec. applied from timing counter 20 to the set terminal S of flip-flop 94. The flip-flop is adapted to be set by the falling edge or side of each pulse $A_{14}$ so as to provide an output of value "1" at its output terminal Q, that is, to initiate an output pulse $P_W$. Further, flip-flop 94 is reset to terminate the output pulse $P_W$, that is, to return the output voltage to "0", in response to the falling edge or side of an output $P_O$ from OR circuit 93.

As is apparent from FIGS. 4B–4E, an output pulse $P_W$ (FIG. 4E) is initiated at the output Q of flip-flop 94 when the circulating code $A_1,A_2 \ldots A_{14}$ returns from the state (11111111111111) to the state (00000000000000). So long as the circulating code $A_1, A_2 \ldots A_{14}$ (FIG. 4B) is not coincident in level with the channel identifying code (FIG. 4C) then being applied to pulse-width modulator 91, one or more of the exclusive OR circuits 901–914 produces an output "1" with the result that the output $P_O$ of OR circuit 93 remains at the level "1" (FIG. 4D). Upon the coincidence of all bits of the circulating code $A_1,A_2 \ldots A_{14}$ with the corresponding bits of the channel identifying code $B_1,B_2 \ldots B_{14}$ during each circulating period T of the circulating code, the outputs of all of the exclusive OR circuits 901–914 attain the value "0", with the result that the output $P_O$ of OR circuit 93 falls from the value "1" to the value "0" so as to reset flip-flop 94 and thereby return the output of the latter to the value "0". Thus, during each circulating period T of the circulating code $A_1,A_2 \ldots A_{14}$ from timing counter 20, an output pulse $P_W$, that is, an output of the value "1", is obtained from flip-flop 94 during the time interval between the return of the circulating code $A_1,A_2 \ldots A_{14}$ from the state (11111111111111) to the state (00000000000000) and the coincidence of the circulating code with the channel identifying code $B_1,B_2 \ldots B_{14}$. Therefore, when a change is effected in the channel identifying code $B_1,B_2 \ldots B_{14}$ being applied to pulse-width modulator 91, a corresponding change occurs in the width of the output pulse $P_W$ obtained from modulator 91 during each circulating period of the circulating code.

For example, as shown on the left-hand portions of FIGS. 4A–4E, if the channel identifying code $B_1,B_2 \ldots B_{14}$ applied to pulse-width modulator 91 is (00000000000001) the output pulse $P_W$ produced during each circulating period of the circulating code $A_1,A_2 \ldots A_{14}$ commences at the beginning of the circulating period, that is, when the circulating code returns from the state (11111111111111) to the state (00000000000000), and each such output pulse $P_W$ terminates at the commencement of the first pulse $A_1$, at which time the circulating code (00000000000001) coincides with the received channel identifying code (00000000000001) to cause the output $P_O$ of OR circuit 93 to fall from "1" to "0". Thus, the output pulse $P_W$ produced during each circulating period of the circulating code has a pulse width of $\tau$. On the other hand, as shown on the middle portion of FIGS. 4A–4E, if the channel identifying code $B_1,B_2 \ldots B_{14}$ being received by the pulse-width modulator 91 is (00000000000010), the coincidence of that channel identifying code with the circulating code $A_1,A_2 \ldots A_{14}$ occurs, during each circulating period of the circulating code, at the commencement of the first pulse $A_2$, so that the resulting output pulse $P_W$ obtained during each circulating period has a width of 2 $\tau$. Similarly, as shown at the right-hand portions of FIGS. 4A–4E, if the channel identifying code $B_1,B_2 \ldots B_{14}$ received by modulator 91 during each circulating period is (00000000000011), the coincidence of such channel identifying code with the circulating code $A_1,A_2 \ldots A_{14}$ during each circulating period of the latter occurs at the commencement of the pulse $A_1$ appearing during the existence of the first pulse $A_2$ so that the resulting output pulse $P_W$ obtained during each circulating period has a pulse-width of 3 $\tau$.

Thus, the output pulses $P_W$ produced by modulator 91 during the successive circulating periods T of the circulating code $A_1,A_2 \ldots A_{14}$ have their pulse-widths determined by the channel identifying code $B_1,B_2 \ldots B_{14}$ then being received by the modulator, and the low pass filter 92 is effective to smooth such output pulses $P_W$ from modulator 91 and to deliver an analog or DC voltage $E_x$ having a value that corresponds to the width of the pulses $P_W$.

In the electronic tuner 100 a signal $V_H, V_L$ or U received from decoder 53 of memory 50 selects either the high band or the low band of a vhf tuning section or the uhf tuning section, respectively, for operation, with the voltage controlled variable reactance element or varactor, such as, a variable capacitance diode, of the selected tuning section being controlled by the analog or DC control voltage $E_x$ from low pass filter 92 for determining the receiving frequency which is applied to the video intermediate frequency amplifier circuit 110.

Referring now to FIG. 5, it will be seen that the AFT circuit 120 provided in accordance with this invention may comprise a conventional frequency discriminator circuit 121 which is connected to the output of the video IF amplifier 110 and provides an AFT voltage $V_T$. As shown on FIG. 6A, the AFT voltage $V_T$ has a predetermined value $V_o$ when the video intermediate frequency $f$ has the correct value $f_o$, and the AFT voltage $V_T$ varies from the value $V_o$ in accordance with a generally S-shaped curve for values of the video intermediate frequency above and below the value $f_o$. The AFT circuit 120 is further shown on FIG. 5 to comprise transistors 122A and 122B constituting a first differential amplifier, and transistors 123A and 123B constituting a second differential amplifier. Reference voltages $V_1$ and $V_2$ having values to satisfy the inequality $V_1 > V_o > V_2$ are respectively applied to the base electrodes of transistors 122A and 123A, while the AFT voltage $V_T$ from circuit 121 is applied to the base electrodes of transistors 122B and 123B. Further, the collector outputs of transistors 122B and 123B are applied to the base electrodes of transistors 124 and 125, respectively, and the collector output of transistor 125 is applied, in turn, to the base electrode of a transistor 126. Finally, the collector output of transistor 124 is delivered through a diode 127 to an output terminal 128U to provide the discriminated output $E_U$ at the latter, and the collector output of transistor 126 is delivered through a diode 129 to an output terminal 128D to provide the discriminated output $E_D$ at the latter.

When the video intermediate frequency from amplifier 110 is in the range $f_B$ which is lower than $(f_o - \Delta f)$ and in which the AFT voltage $V_T$ is larger than the reference voltage $V_1$, transistors 122A and 122B are respectively non-conductive and conductive. Therefore, transistor 124 is turned OFF and, as the result of the foregoing, the discriminated output $E_U$ becomes "1" as shown on FIG. 6E. On the other hand, transistor 123B is turned ON thereby to make transistors 125 and 126 non-conductive and conductive, respectively, so that the discriminated output $E_D$ becomes "0", as shown on FIG. 6F.

If the video intermediate frequency from amplifier 110 is in the range $f_A$ between the frequencies $(f_o - \Delta f)$ and $(f_o + \Delta f)$, that is, within the normal tuning range, the AFT voltage from circuit 121 is between $V_1$ and $V_2$ and, therefore, transistor 123B remains ON and the discriminated output $E_D$ continues to be "0". However, with $V_T$ being less than $V_1$, transistor 122B is turned OFF and, as a result, transistor 124 is made conductive so that the discriminated output $E_U$ becomes "0".

Further, when the video intermediate frequency from amplifier 110 is in the range $f_C$ which is greater than $(f_o + \Delta f)$, and in which the AFT voltage $V_T$ is less than $V_2$, the discriminated output $E_U$ remains "0", but transistor 123B is turned OFF so as to make transistors 125 and 126 conductive and non-conductive, respectively, and, as a result thereof, the discriminated output $E_D$ becomes "1".

Finally, when the video intermediate frequency is in the range $f_D$ lower than the range $f_B$ or in the range $f_E$ higher than the range $f_C$ that is, outside the pull-in range for the AFT operation, the voltage $V_T$ is between the reference voltages $V_1$ and $V_2$ and the discriminated outputs $E_U$ and $E_D$ are both "0".

In the case of a channel selecting apparatus according to this invention for a color television receiver, the reference voltages $V_1$ and $V_2$ of AFT circuit 120 are suitably selected so that $\Delta f$ will be about 50 kHz. In the normal tuned condition, that is, when the frequency $f$ is in the range between $f_o - 50$ kHz and $f_o + 50$ kHz, the discriminated outputs $E_U$ and $E_D$ are both "0" and no correction is to be made in the binary code $B_1, B_2 \ldots B_{14}$ applied to pulse width modulator 91 which determines the local oscillation frequency established in tuner 100. On the other hand, when $f$ is less than $f_o - 50$ kHz within the range $f_B$, the resulting "1" state of discrimated output $E_U$ is effective in sweep pulse generating circuit 30 (FIG. 1) to cause the latter to provide upward correction pulses which are counted by counter 40 for modifying the binary code $B_1, B_2 \ldots B_{14}$ so as to raise the local oscillation frequency and thereby bring the receiver to the normal or correct tuned condition. Conversely, if the frequency $f$ is greater than $f_o + 50$ kHz within the range $f_C$, the resulting "1" state of the discriminated output $E_D$ is effective, in sweep pulse generating circuit 30 to cause downward correction pulses to be applied to counter 40 so that binary code $B_1, B_2 \ldots B_{14}$ being applied from counter 40 to pulse width modulator 91 is modified for decreasing the local oscillation frequency and thereby providing the normal or correct tuned condition of the receiver. The upward and downward correction pulses applied to counter 40 in response to the "1" states of the discriminated outputs $E_U$ and $E_D$, respectively, are the pulses $A_{14}$ from timing counter 20.

More particularly, reference to FIG. 1 will show that, when discriminated output $E_U$ is "1", upward correction pulses having the period of the pulses $A_{14}$ from timing counter 20 are applied to counter 40 by way of the circuit constituted by NAND circuits $38_1$ and 301, inverter 303 and NAND circuits 304 and 308. On the other hand, when the discriminating output $E_D$ is "1", downward correction pulses also having the period of the pulses $A_{14}$ are applied to counter 40 through the circuit constituted by NAND circuits $38_2$ and 302, inverter 305 and NAND circuits 306 and 309. It will be seen that, when any one of the switches 31FU, 31FD, 31CU and 31CD is manually closed, the supplying of up-sweep pulses or down-sweep pulses to counter 40 from circuit 30 in response to the closing of such switch is preferential, that is, the resulting signal applied to each of NAND circuits $38_1$ and $38_2$ through NAND circuit 36 and inverter 37 prevents the passage of any correction pulse through NAND circuit $38_1$ or $38_2$ even though the discriminated output $E_U$ or $E_D$ may then be "1".

In order to inhibit or prevent the AFT operation of the channel selecting apparatus during the operation of address selecting circuit 70 for activating a selected one of the addresses or memory units in memory 50 in a programming or channel selecting mode of the apparatus, the AFT inhibiting circuit 140 is shown to include an inverter 141 which receives the negative pulse $P'_B$ (FIG. 9A) from NAND circuit 44 and provides a corresponding positive pulse which triggers a monostable multivibrator 142 to provide a pulse $M_1$ (FIG. 9C) having a pulse width of, for example, 50 m.sec. The pulse $M_1$ is applied to an inverter 143 to provide a negative inhibit pulse $P_G$ (FIG. 9D) which, as previously mentioned, is applied to NAND circuits 308 and 309 of sweep pulse generating circuit 30. Thus, during the existence or occurrence of the negative inhibit pulse $P_G$, the applying of upward or downward correction pulses through NAND circuit 308 or 309, respectively, to counter 40 is prohibited.

In the normal memory refreshing or rewriting circuit 130, the discriminated outputs $E_U$ and $E_D$ from AFT circuit 120 are supplied through inverters 131a and 131b to a NAND circuit 132 whose output triggers a monostable multivibrator 133. The output $M_2$ (FIG. 9J) of the monostable multivibrator 133 is supplied to the reset terminal of a counter 134 and also to a NAND circuit 135. The up- and down-correction pulses $P_U$ and $P_D$ are applied from circuit 30 to a NAND circuit 136 and the output of the latter is applied to an input of a NAND circuit 137. The output of NAND circuit 137 is applied through an inverter 138 to another input of NAND circuit 135, while the signal $P_A$ from memory control circuit 60 is applied through an inverter 139 to still another input of NAND circuit 135 which has its output applied to counter 134. Thus, the up- and down-correction pulses $P_U$ and $P_D$ are passed through NAND circuit 135 to be counted by counter 134 only upon the occurrence of the output $M_2$ (FIG. 9J), and further only when mode change-over switch 61 engages its fixed contact $b$ for providing the signal or output $P_A$ with the value "0" for establishing the channel selecting mode of operation of the apparatus.

Figure 9N:
Figure 9O:

It will be apparent from the above that, after each operation of address selecting circuit 70 with the apparatus in its channel selecting mode so that the channel identifying code stored at the selected address of memory 50 is read out to the counter 40 and the latter applies the corresponding binary code $B_1, B_2 \ldots B_{14}$ to pulse width modulator 91 for establishing a respective receiving frequency, any operation of AFT circuit 120 for causing circuit 30 to apply upward or downward correcting pulses to counter 40 for modifying the code $B_1, B_2 \ldots B_{14}$ so as to obtain the normal or correct tuned condition also results in such upward or downward correcting pulses being counted by counter 134. In the normal memory rewriting circuit 130, a decoder 1310 is associated with counter 134 and is operative, when counter 134, after being reset by the rising side of pulse or output $M_2$, has counted $n$ upward or downward correcting pulses $P_{UD}$ (FIG. 9K), to provide a negative pulse $E_n$ (FIG. 9L) on its output line $L_n$ by which a flip-flop 1311 is set to provide an output $F_2$ (FIG. 9M). The flip-flop 1311 is reset by the falling side of an output $M_3$ (FIG. 9N) from a monostable multivibrator 1312 so as to terminate the output $F_2$. The monostable multivibrator 1312 is triggered by the falling side or back porch of the output $M_2$ from MM 133. Finally, the outputs $M_3$ and $F_2$ are applied to a NAND circuit 1313 which provides a rewriting instruction $P_M$ having the value "0" (FIG. 9O) during the simultaneous occurrence of outputs $M_3$ and $F_2$. The application of the rewriting instruction $P_M$ to NAND circuit 65 in memory control circuit 60 with the apparatus in its channel selecting mode has substantially the same effect as the closing of the writing switch 62 when the apparatus is in its programming mode. In other words, the application of the rewriting instruction $P_M$ to NAND circuit 65 causes instruction signal forming circuit 67 to supply an erasing pulse $P_E$ and then a writing pulse $P_{WR}$ to the selected memory unit in memory 50 so as to erase the channel identifying code $B_1, B_2 \ldots B_{14}$ previously stored in that memory unit and to write, in place of such channel identifying code, the modified channel identifying code which is then established by counter 40 following the AFT operation. If, for example $n+1$ correction pulses are applied to counter 40 in response to an AFT operation for achieving the normal or correct tuned condition when a channel identifying code is read out of a selected one of the memory units of memory 50, the resulting modified channel identifying code is rewritten in the same memory unit in place of the original channel identifying code. Of course, if less than $n$ correction pulses are applied to counter 40 in response to an AFT operation, flip-flop 1311 is not set and, therefore, the rewriting instruction $P_M$ is not obtained, with the result that the channel identifying code originally written or programmed in the respective memory unit of memory 50 remains unchanged therein.

The above described channel selecting apparatus operates as follows:

PROGRAMMING MODE OF OPERATION

When it is desired to program the channel selecting apparatus, that is, to store at the various addresses in memory 50 channel identifying codes corresponding to various channels that are receivable in the region where the television receiver is located so that, thereafter, such channels can be received or selected merely by actuation of the switches $S_1$-$S_{16}$ corresponding to the respective addresses, the mode change-over switch 61 is engaged with its fixed contact $a$ for selecting the programming mode of operation. If it is desired, for example, to store at the address or memory unit $51_1$ of memory 50 a channel identifying code corresponding to the receiving frequency for channel "one" in the Tokyo area of Japan, the address selecting switch $S_1$ is manually closed. Closing of switch $S_1$ turns ON transistor 77 in address selecting circuit 70 so that the collector output of such transistor has the value "0". Thus, the output of inverter 78 becomes "1" with the result that NAND circuit 79 provides a "0" output on receiving each of the pulses $A_9$ from timing counter 20. The address counter 71 counts each of the "0" outputs from NAND circuit 79 and, when the resulting 4-bit code from address counter 71 corresponds to the address or memory unit $51_1$ selected by the closing of switch $S_1$, the decoder 72 responds to such 4-bit code from address counter 71 to provide a "0" output on the corresponding output line $L_1$. In response to such "0" output on line $L_1$, transistor 77 is turned OFF with the result that the output of NAND circuit 79 remains at "1" and address counter 71 ceases counting. Accordingly, the 4-bit code corresponding to switch $S_1$ is applied to memory 50 for selecting or activating the address or memory unit $51_1$ corresponding to switch $S_1$.

Since channel "one" in the Tokyo area, that is, a low vhg channel, is to be programmed in memory unit $51_1$, switch $S_L$ of the band indicating signal forming circuit 80 is closed to provide an output "1" from the respective inverter $82_L$. Since mode change-over switch 61 is engaged with its fixed contact $a$, its output $P_A$ is "1" and, therefore, the output of NAND circuit $83_L$ becomes "0". Band memory 84 responds to such "0" output from NAND circuit $83_L$ to provide the band selecting pulse $P_L$ which, through encoder 52 and decoder 53 of memory 50 provides the signal for selecting the low band or channel of the vhf tuning section in tuner 100.

Having selected the address or memory unit of memory 50 at which a channel identifying code is to be programmed and the band or section of tuner 100 which is appropriate for the channel to be programmed at such selected address, the sweep pulse generating circuit 30 is made operative, for example, by manually actuating the coarse up-sweep switch 31CU and holding the latter in its closed position. The closing of switch 31CU causes the associated inverter $33_3$ to provide the output "1" to NAND circuit $34_3$. Therefore, at each "0" state of the pulses $A_{14}$ from timing counter 20, which pulses have a period of 4.096 m.sec., NAND circuit $34_3$ provides an output "1". Since the fine up-sweep switch 31FU is open, the output of its associated inverter $33_1$ is "0" and the output of the respective NAND circuit $34_1$ is "1". Therefore, the output of the NAND circuit 304 becomes "0" at every "1" output from NAND circuit $34_3$, that is, at every "0" state of the pulses $A_{14}$. Accordingly, a negative up-sweep pulse $P_U$ appears at the output of NAND circuit 308 at every "0" state of the pulses $A_{14}$ from timing counter 20. Since such pulses $A_{14}$ have a relatively short period of 4.096 m.sec., the pulses $P_U$ appearing while switch 31CU is held in its closed condition may be considered coarse up-sweep pulses which, when being counted by counter 40, cause relatively rapid changes in the count of such counter 40. In other words, when counting the coarse up-sweep pulses $P_U$ from generating circuit 30, the count of counter 40 is changed, in sequence, in the upward direction to similarly change the resulting channel identifying code $B_1, B_2 \ldots B_{14}$ obtained from counter 40 at every circulating period of the circulating code $A_1, A_2 \ldots A_{14}$ from timing counter 20, starting from the state (00000000000000), as shown on FIG. 4C. The changing channel identifying code from counter 40 and the circulating code from timing counter 20 are applied to pulse-width modulator 91 in the programming mode of operation. Since the circulating code $A_1, A_2 \ldots A_{14}$ changes at every time $\tau = 0.25$ sec. which is the width of the pulses $A_1$, the width of the output pulse $P_W$ from modulator 91 is increased by $\tau$ at every circulating period T of the circulating code starting from a pulse width of zero. Thus, so long as switch 31CU of sweep pulse generating circuit 30 is held in its closed condition, the channel selecting or control voltage from low pass filter 92 is increased progressively, for example, by about 2 m.V at every period T=4.096 m.sec. of the circulating code, and hence the receiving frequency established by tuner 100 increases progressively.

When a video picture being broadcast or transmitted by channel "one" appears on the screen of the television receiver, the coarse up-sweep switch 31CU is released by the operator so as to return to its normal open condition. Upon opening of switch 31CU, the supplying of the coarse up-sweep pulses $P_U$ to counter 40 is terminated so that counter 40 ceases its counting action and the channel identifying code $B_1, B_2 \ldots B_{14}$ then obtained from counter 40 determines the approximate value of the receiving frequency of tuner 100 for the desired channel. Thereafter, the fine up-sweep switch 31FU may be manually actuated and held in its closed condition to provide fine up-sweep pulses $P_U$ from NAND circuit 308, which fine up-sweep pulses are derived from the divider 35. In counting the fine up-sweep pulses, the counter 40 sequentially changes the resulting channel identifying code $B_1, B_2 \ldots B_{14}$ at every period 64T=262.144 m.sec. Thus, the width of the output of pulses $P_W$ from pulse-width modulator 91 is increased by $\tau$ at every period 64T and, accordingly, the channel selecting or control voltage from low pass filter 92 is increased by about 2 mV at every period 64T for similarly changing the receiving frequency determined by tuner 100. When viewing of the picture on the screen of the television receiver indicates that fine tuning has been achieved in respect to the video signal broadcast by the desired channel, switch 31FU is released to return to its open condition and thereby halt the supplying of the fine up-sweep pulses to counter 40. Accordingly, counter 40 stops counting with the resulting channel identifying code $B_1, B_2 \ldots B_{14}$ corresponding to a value of the analog control voltage applied from digital-to-analog converter 90 to tuner 100 corresponding to a receiving frequency for the fine-tuned reception of channel "one". Of course, in the illustrated embodiment of the invention, after switch 31CU and/or switch 31FU have been selectively closed to bring the receiving frequency established by the code $B_1, B_2 \ldots B_{14}$ produced by counter 40 to within the so-called pull-in range of AFT circuit 120, the above described AFT operation may be relied upon to further modify such code for obtaining the normal or correct tuned condition for the channel being programmed.

After the normal or correct tuned condition has been realized, either by selective actuation of switches 31CU and 31FU, or by a combination of actuation of such switches and the AFT operation, the writing switch 62 is manually closed so that the associated inverter 64 provides the output "1". Since the mode change-over switch 61 remains engaged with its fixed contact $a$ to provide the output $P_A$ with the value "1", the NAND circuit 63 provides the output "0". As a result of such "0" output from NAND circuit 63, the instruction signal forming circuit 67 first supplies an erasing pulse $P_E$ to memory 50 so as to erase any contents previously stored in the memory unit 51, selected by the closing of switch $S_1$. Then, circuit 67 applies a writing pulse $P_{WR}$ to memory unit $51_1$ with the result that the channel identifying code $B_1, B_2 \ldots B_{14}$ established by counter 40 for fine-tuning of channel "one" and the band identifying signal $P_L$ from band memory 84 are then written in the respective cells of memory unit $51_1$.

Following the programming of memory unit $51_1$ with a channel identifying code and a band indicating code corresponding to channel "one", the other memory units $51_2$–$51_{16}$ of memory 50 may be similarly programmed with coded information corresponding to other vhf and/or uhf channels that are receivable in the region where the television receiver is located.

Although the programming of the channel selecting apparatus according to this invention has been described above as being effected by the sequential closing of the coarse up-sweep switch 31CU and the fine up-sweep switch 31FU, in which case, the coarse or fine up-sweep pulses $P_U$ are counted in the upward direction by counter 40 for progressively increasing the receiving frequency of tuner 100, it will be apparent that the programming operation can be similarly effected by the successive closing of the coarse down-sweep switch 31CD and the fine down-sweep switch 31FD so that counter 40 is made to count in the downward direction for progressively decreasing the receiving frequency of tuner 100. Whether counter 40 is made to count in the upward direction or in the downward direction, as aforesaid, is merely dependent upon the relationship of the receiving frequency for a channel which is to be programmed relative to the receiving frequency for the channel which has been previously programmed and, in each case, the direction in which counter 40 is made to count is selected so as to minimize the time required for the programming operation.

CHANNEL SELECTING MODE OF OPERATION

After the programming of memory 50 has been completed, as described above, the mode change-over switch 61 is manually actuated to engage its fixed contact $b$ and thereby provide the output $P_A$ with the value "0" for estalishing the channel selecting mode of operation for the apparatus. Since writing switch 62 remains in its open position, the output of the associated inverter 64 is "0" and, accordingly, NAND circuit 63 provides the output "1" to instruction signal forming circuit 67 so that the letter supplies the reading pulse $P_R$ to memory 50.

Preferably, when the power source for the channel selecting apparatus is initially turned ON, the address counter 71 of address selecting circuit 70 is reset thereby so that the 4-bit code issuing from counter 71 will activate or address the memory unit $51_1$ in memory 50.

When the power source for the channel selecting apparatus is initially turned ON, the transistor 46 in time constant circuit 47 is made conductive so that its collector output is "0" for a predetermined period of, for example, 50 m.sec., whereupon transistor 46 is turned OFF and its collector output rises to the value "1". Such rise in the collector output of transistor 46 triggers the monstable multivibrator 45 to provide an output pulse from the latter at the level "1" for the predetermined time of 50 m.sec. Since the output $P_A$ from mode change-over switch 61 is "0" for the channel selecting mode of operation, the output from inverter 43 is "1" and, therefore, the output from NAND circuit 44 is "0" for the predetermined time or period of the output pulse from monostable multivibrator 45. Such "0" output or negative signal $P'_B$ from NAND circuit 44 causes the inverter 48 to produce the output "1", that is, the load pulse $P_B$ for the period of the output pulse from monostable multivibrator 45. The load pulse $P_B$, when applied to AND circuits $42_1$–$42_{14}$ in counter 40, allows the read out to counter 40 from memory unit $51_1$ of the channel identifying code $C_1, C_2 \ldots C_{14}$ previously stored therein and which, in the example described above, represents channel "one" in the Tokyo area. At the same time, the band indicating code stored in the respective cells of memory unit $51_1$ is read out from the latter to decoder 53 so that, in the described example, a signal is applied to tuner 100 for selecting the low band of the vhf tuning section. During the existence of load pulse $P_B$, the bits $C_1$-$C_{14}$ of the read out channel identifying code are applied to the respective flip-flops $41_1$-$41_{14}$ of counter 40 with the result that such flip-flops assume the states for providing the channel identifying code $B_1$-$B_{14}$ from counter 40 to pulse-width modulator 91 which, during programming, was determined to correspond to a control voltage for tuner 100 suitable for fine tuning of the receiving frequency to that of channel "one". Therefore, upon the initial supplying of power to the channel selecting apparatus, the latter tunes the television receiver for the reception of the channel which has been programmed into the first address or memory unit $51_1$ of memory 50.

Thereafter, if it is desired to receive a channel programmed in a memory unit of memory 50 other than the first address or memory unit $51_1$, for example, if it is desired to receive channel "three" which has been programmed in the second memory unit $51_2$, the switch $S_2$ of the address selecting circuit 70 is manually closed and, as previously described in connection with the programming mode of operation, the address counter 71 counts the pulses $A_9$ until the 4-bit code from address counter 71 addresses the second memory unit $51_2$ for causing read out of the channel identifying code and band indicating code stored in that memory unit during the programming of channel "three" in memory unit $51_2$. When the code from address counter 71 addresses the memory unit corresponding to closed switch $S_2$, decoder 72 provides the signal "0" on the respective output line $L_2$ so that transistor 77 is turned OFF and its collector output rises from "0" to "1". Such rise in the collector output of transistor 77 triggers monostable multivibrator 45 and, as previously described, the output from monostable multivibrator 45 results in the production of a load pulse $P_B$ from inverter 48. In response to the load pulse $P_B$, the channel identifying code being read out of memory unit $51_2$ correspondingly changes the states of the flip-flops of the counter 40 so that the latter provides the corresponding channel identifying code $B_1, B_2 \ldots B_{14}$ to pulse width modulator 91. Therefore, the output pulse $P_W$ obtained from modulator 91 during each circulating period of the circulating code $A_1, A_2 \ldots A_{14}$ has its width determined by the channel identifying code so as to result in an analog control voltage $E_x$ from low pass filter 92 to tuner 100 sufficient to cause the latter to establish the receiving frequency for channel "three".

It will be apparent that the channels programmed in the other memory units $51_3$-$51_{16}$ may be similarly selectively received merely by manual closing of a respective one of the address selecting switches $S_1$-$S_{16}$.

Although memory 50 is initially programmed with channel identifying codes $B_1, B_2 \ldots B_{14}$ which, when selectively applied to pulse width modulator 91, provide control voltages to the varactor of tuner 100 for obtaining the receiving frequency or normal tuned condition for the respective channels, with time, a shift from such normal tuned condition may occur due to a temperature drift, annual variation or the like in the electronic tuning tuner 100. In other words, at some time after the programming of a memory unit in memory 50 with a channel identifying code, the control voltage for tuner 100 that results from the application of the programmed code to digital-to-analog converter 90 in the channel selecting mode of the apparatus may no longer establish the receiving frequency for the normal tuned condition of the respective channel. In that event, and assuming that the deviation of the receiving frequency established by the programmed code from the correct receiving frequency for the respective channel is within the pull-in range for the AFT operation, AFT circuit 120 provides a discriminated output $E_U$ or $E_D$ to cause circuit 30 to apply upward or downward correcting pulses to counter 40 for modifying the channel identifying code $B_1, B_2 \ldots B_{14}$ applied from counter 40 to converter 90 until the normal tuned condition is restored, as previously described.

It should be noted that the foregoing AFT operation in the channel selecting mode of the apparatus is delayed to commence a predetermined time after power is first applied to the apparatus, or after a selected one of the switches $S_1, S_2 \ldots S_{16}$ is closed for selecting a respective one of the memory units in memory 50 for read out of the channel identifying code stored therein. More particularly, when the power source for the apparatus is initially turned ON, or when one of the switches $S_1$-$S_{16}$ is closed, the resulting negative signal $P'_B$ applied through inverter 141 triggers monostable multivibrator 142 to provide the output $M_1$ which, through inverter 143, forms the negative inhibit pulse $P_G$ for 50 m.sec. During that period of time, the inhibit pulse $P_G$ applied to NAND circuits 308 and 309 prevents upward or downward correction pulses from reaching counter 40 even though AFT circuit may then be providing the discriminated output $E_U$ or $E_D$. Thus, the onset of the AFT operation is delayed until the address selecting circuit 70 has completed the previously described operations of selecting the first memory unit 51, in memory 50 in response to the initial connection of the apparatus to its power source, or of selecting some other memory unit in response to the closing of respective one of switches $S_1$-$S_{16}$, and until the control voltage $E_x$ (FIG. 9B) applied to tuner 100 has been established at the level corresponding to the channel identifying code being read out of the selected memory unit. The foregoing delay in the onset of the AFT operation avoids the possibility that the AFT operation will seek to pull-in the local oscillation frequency at some region other than the desired normal tuned condition if the AFT operation is permitted when power is first applied to the apparatus or when circuit 70 is changing over from the selection of one to another of the addresses in memory 50.

When the AFT operation does occur with the apparatus in its channel selecting mode, the upward or downward correction pulses $P_U, P_D$ counted by counter 40 for modifying the code $B_1, B_2 \ldots B_{14}$ applied from the latter to digital-to-analog converter 90 so as to obtain the normal tuned condition, are also counted by counter 134. When the number of such upward or downward correction pulses reaches $n$, that is, when the receiving frequency resulting from the channel identifying code stored in the selected memory unit of memory 50 is at least a predetermined amount greater than or less than the local oscillation frequency for the normal or correct tuned condition, but still within the pull-in range of the AFT circuit, the normal memory rewriting circuit 130 provides the rewriting instruction $P_M$. As previously described, such rewriting instruction causes the modified channel identifying code $B_1, B_2 \ldots B_{14}$ then produced by counter 40 to be written in the selected memory unit in place of the channel identifying code previously written therein.

By reason of the above described normal rewriting operation, if the tuner 100 undergoes a progressive change in its control voltage-receiving frequency characteristic due to temperature drift, annual variation or the like, the AFT operation provides the normal or correct tuned condition upon each periodic selection of each memory unit for reception of the respective channel provided that the change in the control voltage-receiving frequency characteristic of the tuner is not so great, in the interval between successive selections of a particular memory unit, as to cause the receiving frequency established by the channel identifying code read out of such memory unit to be outside the pull-in range of the AFT operation. If the several memory units are each regularly selected, the change in the control voltage-receiving frequency characteristic in any of the intervals between successive selections of each memory unit is not likely to cause the deviation of the established receiving frequency from the correct receiving frequency, in any such interval, to exceed the pull-in range of the AFT operation. Moreover, at the time of each of the regular selections of each of the memory units, if the resulting AFT operation modifies the channel identifying code read out of such memory unit by a predetermined amount, the code stored in the memory unit is replaced by a new code corresponding to the changed control voltage-receiving frequency characteristic of the tuner for ensuring that the pull-in range of the AFT circuit is not exceeded as a result of a cumulative change in the control voltage-receiving frequency characteristic occurring over an extended period during which each memory unit is repeatedly selected.

However, if any one of the memory units $51_1$–$51_{16}$ is only infrequently selected for reception of the respective channel identified by the digital code originally programmed or stored therein, the change in the control voltage-receiving frequency characteristic of the tuner occurring in the long interval between successive selections of that memory unit may be so large as to cause the receiving frequency established by the respective channel identifying code to be outside the pull-in range of the AFT operation, for example, in the low range $f_D$ or the high range $f_E$ on FIG. 6F. If the receiving frequency established by a channel identifying code being read out of memory 50 is outside the pull-in range for AFT operation, as aforesaid, both discriminated outputs $E_U$ and $E_D$ from AFT circuit 120 are simultaneously "0", as is apparent from FIGS. 6E and 6F, with the result that the outputs of NAND circuits $38_1$ and $38_2$ in sweep pulse generating circuit 30 are "1" each time the pulse $A_{14}$ becomes "1". Since the switches 31FU, 31FD, 31CU and 31CD are all open in the channel selecting mode of operation, the outputs of NAND circuits $34_1$–$34_4$ are all "1" so that the outputs of NAND circuits 301 and 302 are "0" in response to the "1" outputs from NAND circuits $38_1$ and $38_2$ and the outputs of inverters 303 and 305 are "1". Such "1" outputs from inverters 303 and 305 produce "0" outputs from NAND circuits 304 and 306, respectively, so that, in the absence of the negative AFT inhibit pulse $P_G$, that is, with the output of inverter 143 being at the level "1", the outputs of NAND circuits 308 and 309 remain at the level "1" and neither upward- nor downward-correction pulses $P_U$ or $P_D$ are applied to counter 40 for correcting or modifying the channel identifying code. In other words, the AFT operation for obtaining the correct receiving frequency is not realized when the receiving frequency established by the channel identifying code read out of memory 50 is outside the pull-in range of the AFT operation.

In order to avoid the above problem, the channel selecting apparatus according to this invention is shown on FIG. 1 to further comprise a circuit 150 which detects when the receiving frequency established by a channel identifying code read out of memory 50 is outside of the pull-in range of AFT circuit 120 and, in response to such detection, causes sweep pulse generating circuit 30 to effect sweeping changes in the digital code being applied from counter 40 to the digital-to-analog converter 90 so as to cyclically vary the receiving frequency and, in the course thereof, bring the receiving frequency into the pull-in range for the AFT circuit 120. More particularly, the circuit 150 is shown to receive the discriminated outputs $E_U$ and $E_D$ from AFT circuit 120 so as to detect that the established receiving frequency is outside the pull-in range of AFT circuit 120 when the outputs $E_U$ and $E_D$ are both "0". Moreover, a monostable multivibrator 151 is triggered by the rising side or back porch of the AFT inhibit pulse $P_G$ (FIG. 9D) to provide a positive pulse $P_C$ (FIG. 9E) which is applied to circuit 150 for iniating operation of the latter. Upon such initiation of the operation of circuit 150, and so long as discriminated outputs $E_U$ and $E_D$ are both "0", circuit 150 applies to NAND circuit 304 an output $V_U$ of "0" each time the pulse $A_{14}$ becomes "1" during the relatively short, spaced intervals $T_1$ and $T_4$ (FIG. 9G), and circuit 150 further applies to NAND circuit 306 an output $V_D$ of "0" each time the pulse $A_{14}$ becomes "1" during the successive intervals $T_2$ and $T_3$ between intervals $T_1$ and $T_4$. When the outputs $V_U$ and $V_D$ become "0", the outputs of NAND circuits 304 and 306 become "1". Since the negative AFT inhibit pulse $P_G$ applied to NAND circuits 308 and 309 has terminated prior to the initiation of operation of circuit 150, the ouputs $V_U$ from circuit 150 result in upward sweep pulses $P_U$ from NAND circuit 308 to be counted by counter 40, and the outputs $V_D$ result in downward sweep pulses $P_D$ to be counted by counter 40. Therefore, the operation of circuit 150 tends to increase the receiving frequency during the interval $T_1$, for example, from the receiving frequency $f_a$ which is outside the pull-in range of AFT circuit 120 (FIG. 6B), and, in the event that the increase in the receiving frequency does not bring the latter into the pull-in range, the circuit 150 tends to decrease the receiving frequency during the intervals $T_2$ and $T_3$ to below the original or starting receiving frequency. Finally, if the foregoing decrease in the receiving frequency does not bring the latter into the pull-in range of the AFT operation, the circuit 150 then increases or returns the receiving frequency to its original or starting value during the interval $T_4$. Moreover, in the event that the foregoing cyclical change in the receiving frequency effected by the operation of circuit 150 does not bring the receiving frequency into the pull-in range of AFT circuit 120, for example, as at 1a on FIG. 6C, the circuit 150 of the illustrated embodiment of the invention provides a signal $P_F$ which initiates operation of a circuit 160.

As generally shown in FIG. 1, the circuit 160 further receives the pulse $A_{14}$ from timing counter 20 and the discriminated outputs $E_U$ and $E_D$ from AFT circuit 120. Upon initiation of the operation of circuit 160 by signal $P_F$, circuit 160 causes sweep pulse generating circuit 30 to effect relatively large sweeping changes in the digital code being applied from counter 40 to digital-to-analog converter 90 so as to produce relatively large cyclical variations in the receiving frequency and, in the course thereof, bring the receiving frequency into the pull-in range of AFT circuit 120 so that the latter can then establish the correct or tuned condition. More particularly, upon the initiation of its operation by the signal $P_F$, and so long as discriminated outputs $E_U$ and $E_D$ are both "0", circuit 160 applies to NAND circuit 306 an output $S_D$ of "0" each time the pulse $A_{14}$ becomes "1" during the relatively long spaced intervals $T_5$ and $T_7$ (FIG. 10J), and circuit 160 further applies to NAND circuit 304 an output $S_U$ of "0" each time the pulse $A_{14}$ becomes "1" during the intervening interval $T_6$ (FIG. 10K) which is twice the length of either of the intervals $T_5$ and $T_7$. When the outputs $S_U$ and $S_D$ become "0", the outputs of NAND circuits 304 and 306 become "1". Since the negative AFT inhibit pulse $P_G$ applied to NAND circuits 308 and 309 has terminated prior to the initiation of operation of circuit 160, the outputs $S_U$ from circuit 160 result in upward sweep pulses $P_U$ from NAND circuit 308 to be counted by counter 40, and the outputs $S_D$ result in downward sweep pulses $P_D$ to be counted by counter 40. Therefore, the operation of circuit 160 tends to decrease the receiving frequency during the interval $T_5$, for example, from the receiving frequency $f_B$ which is outside the pull-in range of AFT circuit 120 (FIG. 6D), and, in the event that the decrease in the receiving frequency does not bring the latter into the pull-in range, the circuit 160 tends to increase the receiving frequency during the interval $T_6$ to above the original or starting receiving frequency for bringing the receiving frequency into the pull-in range. When the receiving frequency is brought into the pull-in range of AFT circuit 120 by the pulses $S_D$ and $S_U$, discriminated output $E_D$ or $E_U$, respectively, of circuit 120 becomes "1" to halt the further issuance of pulses $S_D$ or $S_U$, and AFT circuit 120 then becomes operative to further modify the digital code applied by counter 40 to converter 90 until the tuned condition is attained and $E_D$ and $E_U$ are again both "0". Furthermore, during the operation of circuit 160 to bring the receiving frequency into the pull-in range of AFT circuit 120 and then during the AFT operation to bring the receiving frequency to the correct or tuned condition, circuit 160 provides a rewriting inhibit signal $F_M$ which is applied to NAND circuit 137 of the rewriting circuit 130, and which prevents the counting by counter 134 of the pulses $P_D$ or $P_U$ applies to counter 40 in response to the pulses $S_D$ or $S_U$, respectively, and, thereafter, during the AFT operation. Finally, when the correct or tuned condition is obtained following the operation of circuit 160 and then of AFT circuit 120, circuit 160 provides a rewriting instruction $P_N$ which is also applied to NAND circuit 65 of memory control 60. In response to such rewriting instruction $P_N$, the digital code from counter 40 which results in the correct or tuned condition is rewritten or stored in the selected memory unit in place of the channel identifying code previously stored thereon.

Figure 7:
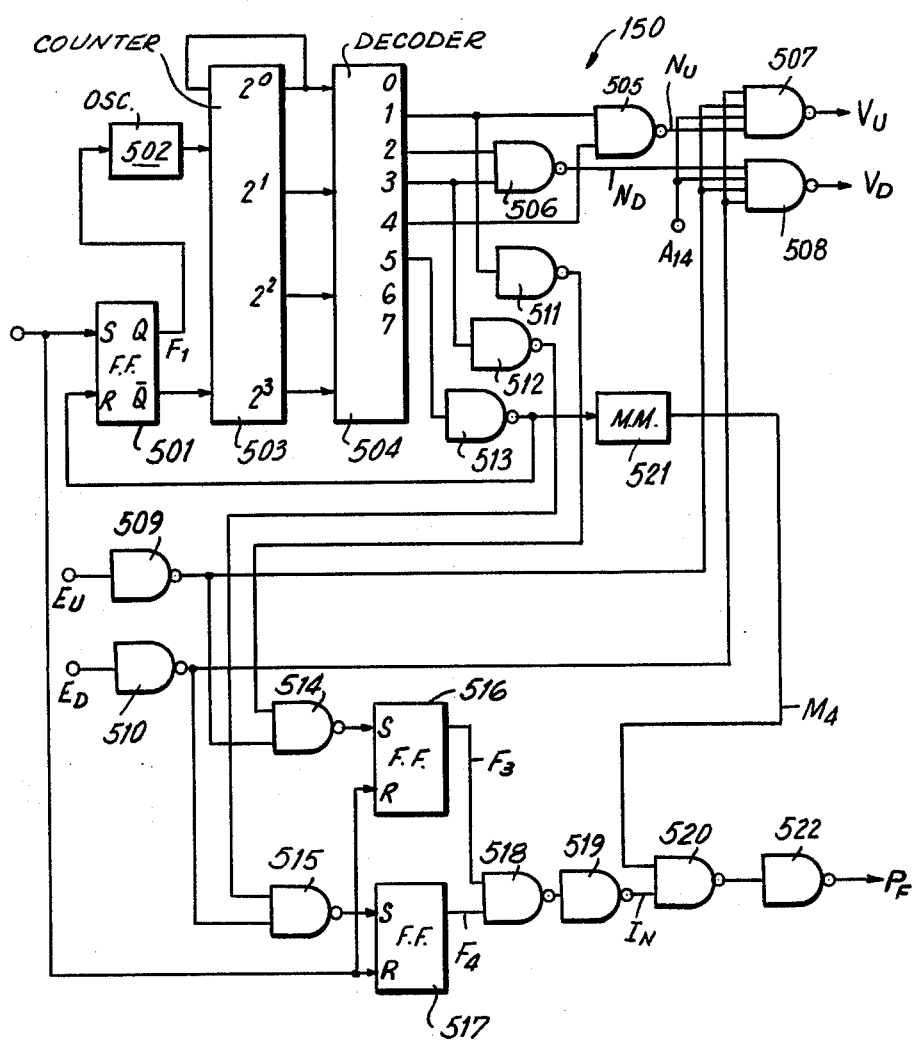
FIG. 7 is a detail block diagram of a detecting circuit included in the channel selecting apparatus of FIG. 1 for detecting deviations of an established receiving frequency outside the pull-in range of the AFT operation.
Figure 9P:
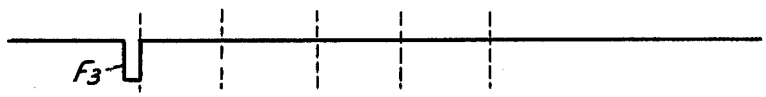
Figure 9Q:
Figure 9R:
Figure 9S:
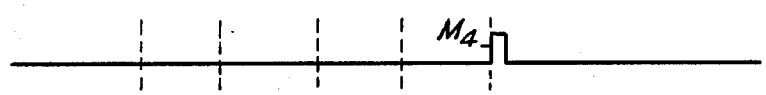
Figure 9T:
Figure 9U:
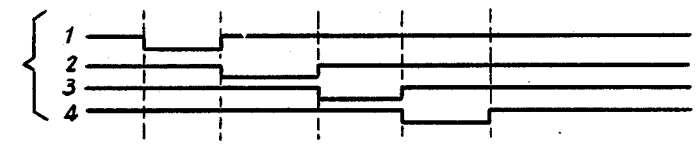

Referring in detail to FIG. 7, it will be seen that the circuit 150 of the channel selecting apparatus according to this invention may comprise a flip-flop 501 which is set by the falling side or back porch of the output $P_C$ from monostable multivibrator 151 so as to provide a positive output $F_1$ (FIG. 9F) which initiates oscillation of an oscillator 502 for providing negative pulses $Q_O$ (FIG. 9G) having a period of, for example, 20 m.sec., and which are fed to a counter 503. The counter 503 counts the pulses $Q_O$ and provides a corresponding 4-bit code which is applied to a decoder 504 having output lines 1,2,3,4, and 5 at which outputs "0" appear successively in response to the successive pulses $Q_O$ (FIG. 9U). The output lines 1 and 4 of decoder 504 are connected to a NAND circuit 505, while the output lines 2 and 3 of decoder 504 are connected to a NAND circuit 506. Accordingly, the output $N_U$ of the NAND circuit 505 (FIG. 9H) becomes "1" during the intervals $T_1$ and $T_4$ between the first and second pulses $Q_O$ and between the fourth and fifth pulses $Q_O$, while the output $N_D$ of the NAND circuit 506 (FIG. 9I) becomes "1" during the intervals $T_2$ and $T_3$ between the second and third pulses $Q_O$ and between the third and fourth pulses $Q_O$, respectively. The outputs $N_U$ and $N_D$ of NAND circuits 505 and 506 are applied to NAND circuits 507 and 508, respectively, which each also receive the pulses $A_{14}$ from timing counter 20. Accordingly, in the intervals $T_1$ and $T_4$, the output $V_U$ of NAND circuit 507 can be "0" each time the pulse $A_{14}$ becomes "1," whereas, in the intervals $T_2$ and $T_3$, the output $V_D$ of NAND circuit 508 can become "0" each time the pulse $A_{14}$ becomes "1". As previously mentioned, the outputs $V_U$ and $V_D$ of NAND circuits 507 and 508 are respectively applied to the NAND circuits 304 and 306 of sweep pulse generating circuit 30.

Figure 9V:
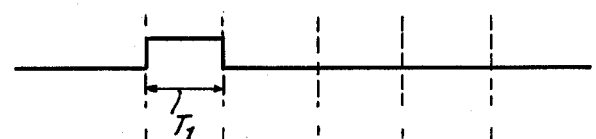
Figure 9W:
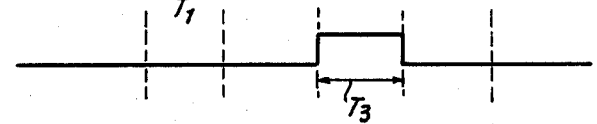
Figure 9X:
Figure 9Y:
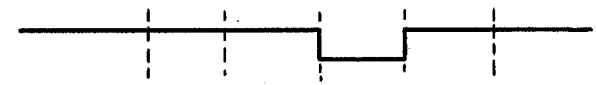
Figure 9Z:
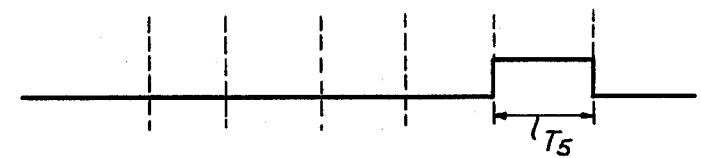

As further shown on FIG. 7, in the circuit 150, the discriminated outputs $E_U$ and $E_D$ from AFT circuit 120 are applied to inverters 509 and 510, respectively, which each have their outputs connected to both NAND circuits 507 and 508. Accordingly, the outputs or pulses $V_U$ and $V_D$ can become "0," as described above, only when the discriminated outputs $E_U$ and $E_D$ are both "0", that is, only when the receiving frequency established in response to the digital code being applied from counter 40 to converter 90 is outside the pull-in range $f_B$ or $f_C$ (FIG. 6F) of AFT circuit 120. The output lines 1, 3, and 5 of decoder 504 are further connected to inverters 511, 512 and 513, respectively. The outputs of inverters 511 and 512 (FIGS. 9V and 9W) which become "1" during the intervals $T_1$ and $T_3$, respectively, are applied to NAND circuits 514 and 515 which also receive the outputs of inverters 509 and 510, respectively. The output of inverter 513 (FIG. 9Z) which becomes "1" in the interval $T_5$ initiated by the fifth pulse $Q_O$ from oscillator 502 is applied to the reset terminal R of flip-flop 501 for resetting the latter so as to halt the operation of oscillator 502 and further to provide an inverted output $\bar{Q}$ from flip-flop 501 which resets counter 503. Flip-flops 516 and 517 which are reset at the rising side of pulse or signal $P_C$, are respectively set when the outputs of NAND circuits 514 and 515 (FIGS. 9X and 9Y) become "0" in the intervals $T_1$ and $T_3$, respectively, provided that discriminated outputs $E_U$ and $E_D$ are then "0." The outputs $F_3$ and $F_4$ (FIGS. 9P and 9Q) of flip-flops 516 and 517, respectively, which each become "1" when the respective flip-flop is set, are applied to a NAND circuit 518 which has its output pulse $M_4$ (FIG. 9S) from a monostable multivibrator 521 which is triggered by the output of inverter 513 when such output becomes "1" at the commencement of interval $T_5$. Finally, in circuit 150, the output of NAND circuit 520 is applied to an inverter 522 which, in turn, provides the pulse or signal $P_F$ (FIG. 9T) which is applied to circuit 160 for initiating the operation of the latter when the operation of circuit 150 has not been effective to bring the receiving frequency within the pull-in range of AFT circuit 120.

Figure 8:
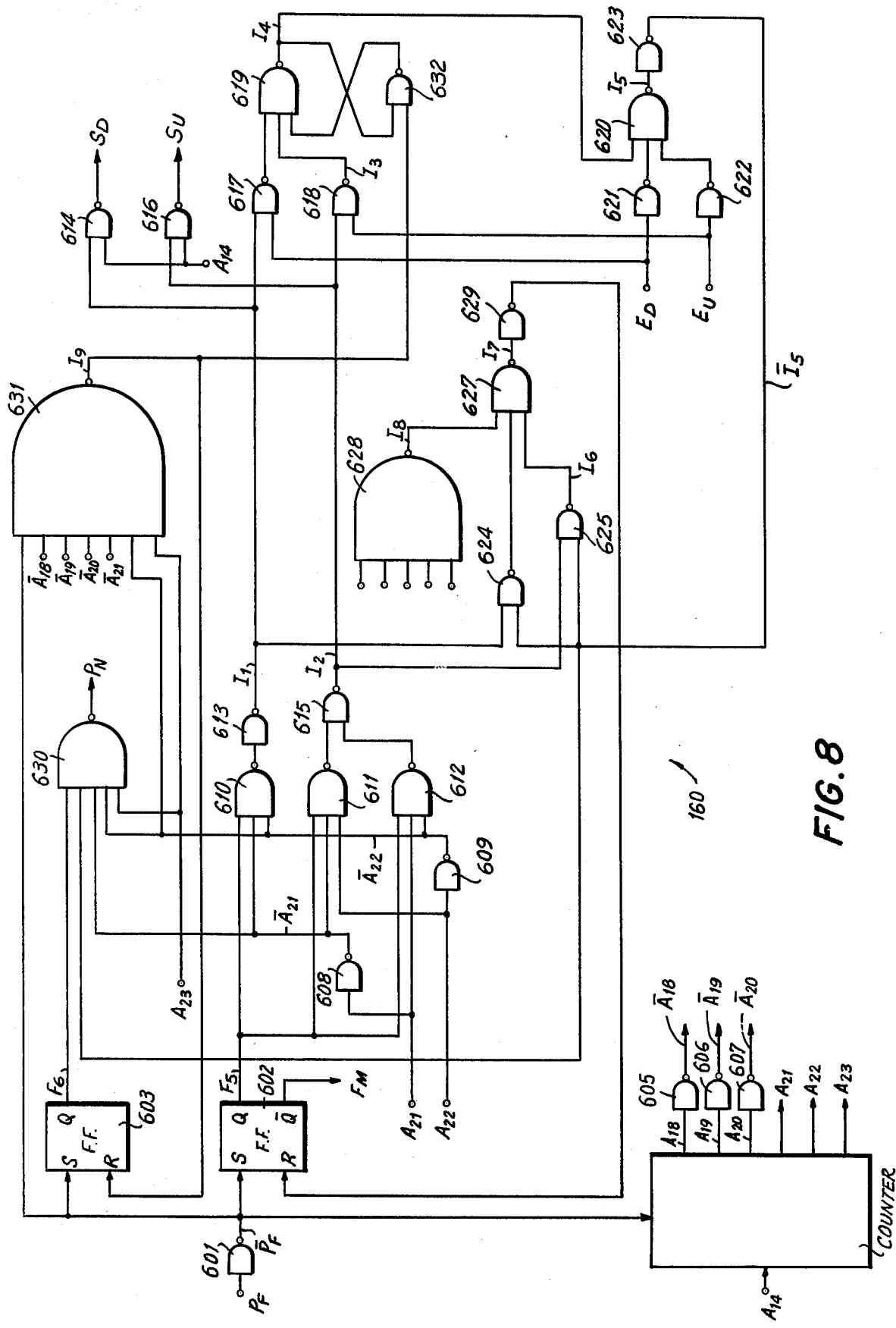
FIG. 8 is a detail block diagram of a circuit included in the channel selecting apparatus of FIG. 1 for controlling the rewriting of a programmed channel identifying code when the latter establishes a receiving frequency that deviates by a large amount from the correct receiving frequency.

Referring now to FIG. 8, it will be seen that, in the channel selecting apparatus according to this invention, the circuit 160 may comprise an inverter 601 which receives the pulse or signal $P_F$ (FIG. 10A) from circuit 150 to provide a corresponding inverted pulse $\overline{P}_F$ which is employed to set a flip-flop 602 and a flip-flop 603, and further to reset a counter 604 which receives the pulse $A_{14}$ from timing counter 20. In counter 604, the pulses $A_{14}$ are frequency-divided to produce pulses $A_{18}, A_{19}, A_{20}, A_{21}, A_{22}$ and $A_{23}$ (FIGS. 10B–10G) having periods which are respectively $2^4, 2^5, 2^6, 2^7, 2^8$ and $2^9$ times the period of the pulses $A_{14}$, and the pulses $A_{18}, A_{19}$ and $A_{20}$ are applied to inverters 605, 606 and 607, respectively, to provide reversed outputs or inverted pulses $\overline{A}_{18}, \overline{A}_{19}$ and $\overline{A}_{20}$. The pulses $A_{21}$ and $A_{22}$ are applied to inverters 608 and 609, respectively, and the outputs $\overline{A}_{21}$ and $\overline{A}_{22}$ of inverters 608 and 609 are applied to a NAND circuit 610 along with the output $F_5$ (FIG. 10H) of flip-flop 602. Such output $F_5$ of flip-flop 602 is also applied to a NAND circuit 611 which also receives the output $\overline{A}_{21}$ of inverter 608 and pulses $A_{22}$, and to a NAND circuit 612 which also receives the output $\overline{A}_{22}$ of inverter 609 and pulses $A_{21}$. The output of NAND circuit 610 is applied to an inverter 613 and the output $I_1$ (FIG. 10J) of the latter is applied to a NAND circuit 614 which also receives the pulses $A_{14}$ for providing, at its output, the pulses $S_D$ to be applied to NAND circuit 306 in the sweep pulse generating circuit 30. The outputs of NAND circuits 611 and 612 are applied to a NAND circuit 615 and the output $I_2$ (FIG. 10K) of the latter is applied to a NAND circuit 616 which also receives the pulses $A_{14}$ so as to provide, at its output, the pulses $S_U$ to the applied to the NAND circuit 304 in the sweep pulse generating circuit 30. The output $I_1$ of inverter 613 and the discriminated output $E_D$ of AFT circuit 120 are applied to a NAND circuit 617, while the putput $I_2$ of NAND circuit 615 and the discriminated output $E_U$ of circuit 120 are applied to a NAND circuit 618. The output $I_3$ (FIG. 10M) of NAND circuit 618 and the output of NAND circuit 617 are applied to a NAND circuit 619, and the output $I_4$ (FIG. 10N) of the latter is applied to a NAND circuit 620 which also receives the outputs of inverters 621 and 622 to which the discriminated outputs $E_D$ and $E_U$ are respectively applied. The output $I_5$ (FIG. 10-0) of NAND circuit 620 is applied to an inverter 623 and the output of the latter is applied to NAND circuits 624 and 625 which also respectively receive the outputs $I_1$ and $I_2$ of inverter 613 and NAND circuit 615, respectively. The output of NAND circuit 624 is passed through an inverter 626 to a NAND circuit 627 which further receives the output $I_6$ (FIG. 10P) of NAND circuit 625 and the output $I_8$ (FIG. 10R) of a NAND circuit 628 to which the inverted pulses $\overline{A}_{18}, \overline{A}_{19}$ and $\overline{A}_{20}$ and the pulses $A_{21}$ and $A_{22}$ are all applied. The resulting output $I_7$ (FIG. 10Q) of NAND circuit 627 is applied through an inverter 629 to the reset terminal R of flip-flop 602 which provides the rewriting inhibit signal $F_M$ at its inverted output terminal $\overline{Q}$ for application to NAND circuit 137 in the normal rewriting circuit 130.

When flip-flop 603 is set by the falling side or front porch of the signal $\overline{P}_F$ from inverter 601, the signal $F_6$ (FIG. 10S) from the output Q of flip-flop 603 becomes "1" and is applied to an input of a NAND circuit 630. Other inputs of NAND circuit 630 respectively receive the inverted signal $\overline{I}_5$ from inverter 523, the inverted pulses $\overline{A}_{21}$ and $\overline{A}_{22}$ from inverters 608 and 609, and the pulses $A_{23}$, and the output of NAND circuit 630 provides the rewriting instruction or signal $P_N$ (FIG. 10T) which is applied to NAND circuit 65 in memory control 60.

The inverted signal $\overline{P}_F$ from inverter 601 is further applied to an input of a NAND circuit 631 which, at other inputs thereof, receives the inverted pulses $\overline{A}_{18}, \overline{A}_{19}, \overline{A}_{20}$ and $\overline{A}_{21}$ from the inverters 605, 606, 607 and 609, and the pulses $A_{21}$ and $A_{23}$, respectively. The output $I_9$ (FIG. 10U) from NAND circuit 631, which is normally "1", is applied to the reset terminal R of flip-flop 603 for resetting the latter when output $I_9$ becomes "0". The output $I_9$ from NAND circuit 631 is further applied to an input of a NAND circuit 632 which, at another input, receives the output $I_4$ (FIG. 10N) from NAND circuit 619, and the output of NAND circuit 632 is applied to an input of NAND circuit 619 which, as previously mentioned, receives the outputs of NAND circuits 617 and 618 at its other inputs.

Since the pulse or signal $P_C$ for initiating operation of circuit 150 is obtained in response to the occurrence of the pulse $P'_B$ which can occur only with the channel selecting apparatus in its channel selecting mode of operation, and since the pulse $P_F$ for initiating operation of the circuit 160 can occur only following operation of the circuit 150, it will be apparent that the circuits 150 and 160 remain inoperative whenever the channel selecting apparatus is in its programming mode of operation.

However, when the apparatus is in its channel selecting mode of operation, the initial connection of the apparatus to a voltage source or operation of the address selecting circuit 70 is effective to provide the negative pulse $P'_B$ (FIG. 9A) from inventer 44, as previously described, with the result that the AFT inhibit circuit 140 provides the AFT inhibit pulse of signal $P_G$ (FIG. 9D) which is applied to NAND circuits 308 and 309 of sweep pulse generating circuit 30. Thus, the outputs of NAND circuits 308 and 309 remain at "1" for maintaining the condition of counter 40 in correspondence to the channel identifying code $C_1, C_2 \ldots C_{14}$ then being read out of the selected address or memory unit in memory 50 until the control voltage $E_X$ (FIG. 9B) from low pass filter 92 has stabilized at the value corresponding to the read out channel identifying code. At the conclusion of the inhibit pulse $P_G$, the resultant triggering of monostable multivibrator 151 provides the positive pulse $P_C$ (FIG. 9E) for setting flip-flop 501 of circuit 150, with the result that the output $F_1$ of such flip-flop becomes "1" (FIG. 9F) for effecting operation of oscillator 502.

As previously described, the pulses $Q_0$ from oscillator 502, which may have a period of 20 m.sec., are counted by counter 503 which cooperates with decoder 504 to cause the output $N_U$ (FIG. 9H) of NAND circuit 505 to become "1" during the spaced apart intervals $T_1$ and $T_4$, while the output $N_D$ of NAND circuit 506 (FIG. 9I) becomes "1" during the intervening intervals $T_2$ and $T_3$. Accordingly, in the intervals $T_1$ and $T_4$ the output $V_u$ of NAND circuit 507 can be "0" each time the pulse $A_{14}$ becomes "1" and, in the intervals $T_2$ and $T_3$, the output $V_D$ of NAND circuit 508 can be "0" each time the pulse $A_{14}$ becomes "1". In the sweep pulse generating circuit 30, whenever the output $V_U$ or $V_D$ becomes "0", the output of NAND circuit 304 or 306, respectively, becomes "1", and hence the output $P_U$ or $P_D$ of NAND circuit 308 or 309, respectively, beomes "0". In other words, upward correcting pulses $P_U$ or downward correcting pulses $P_D$ are applied to counter 40 in response to the outputs of pulses $V_U$ or $V_D$ from circuit 150.

Therefore, in the intervals $T_1$ and $T_4$, the counter 40 may be made to count in the adding or upward direction for increasing the receiving frequency while, in the intervals $T_2$ and $T_3$, counter 40 may be made to count in the downward or subtracting direction for decreasing the receiving frequency.

Accordingly, when the operation of circuit 150 is initiated by the pulse or signal $P_C$, such operation of circuit 150 first tends to increase the receiving frequency by a predetermined amount, for example, 100 KHz, whereupon circuit 150 tends to decrease the receiving frequency by twice such predetermined amount, for example, by 200 KHz, and finally circuit 150 tends to again increase the receiving frequency by the predetermined amount of, for example, 100 KHz, for returning the receiving frequency to the original value established by the channel identifying code read out of memory 50. However, the foregoing operations of circuit 150 are varied in accordance with the conditions of the discriminated outputs $E_U$ and $E_D$ obtained from AFT circuit 120, and which are applied through inverters 509 and 510 to NAND circuits 507 and 508 so as to permit the previously described outputs or pulses $V_U$ and $V_D$ to become "0" only when the discriminated outputs $E_U$ and $E_D$ are both "0". In view of the foregoing, it will be apparent that the operations of circuit 150 will be varied in dependence upon whether the receiving frequency established by the channel identifying code read out of a selected memory unit of memory 50 provides the correct tuned condition for the respective channel, or whether such established receiving frequency is within or outside of the pull-in range of AFT circuit 120.

ESTABLISHED RECEIVING FREQUENCY PROVIDES THE CORRECT OR TUNED CONDITION

When the channel identifying code read out of a selected memory unit in memory 50 establishes a receiving frequency which corresponds to the correct or tuned condition for the respective channel, that is, when the established receiving frequency is in the range $f_A$ on FIG. 6F, the discriminated outputs $E_U$ and $E_D$ of AFT circuit 120 are both "0" (FIGS. 6E and 6F) when the pulse $P_C$ is applied to circuit 150. In the sweep pulse generating circuit 30, since the discriminated outputs $E_U$ and $E_D$ are both "0", the outputs of NAND circuits $38_1$ and $38_2$ are both "1". Further, since switches 31FU, 31FD, 31CU and 31CD are all opened in the channel selecting mode of operation of the apparatus, the outputs of inverters $33_1$-$33_4$ are "0", and the outputs of NAND circuits $34_1$-$34_4$ are "1". Therefore, the outputs of NAND circuits 301 and 302 are "0", and the outputs of the respective inverters 303 and 305 applied to NAND circuits 304 and 306 are "1". On the other hand, in circuit 150, since the outputs of inverters 509 and 510 are "1" in response to the discriminated outputs $E_U$ and $E_D$ being "0", each time the pulse $A_{14}$ becomes "1" in the interval $T_1$ the output $V_U$ of NAND circuit 507 becomes "0" and, thus, the output of NAND circuit 304 is "1" to provide a corresponding upward correcting pulse $P_U$ from NAND circuit 308. The counter 40 counts the successive upward correcting pulses $P_U$ from NAND circuit 308 so that the receiving frequency tends to increase from the correct tuned condition in the range $f_A$. However, when the receiving frequency, in rising during the interval $T_1$ from an original established receiving frequency in the range $f_A$, reaches the upper limit of range $f_A$, the discriminated output $E_D$ of circuit 120 becomes "1", with the result that the output of inverter 510 applied to NAND circuits 507 and 508 becomes "0" and, accordingly, the outputs $V_U$ and $V_D$ of NAND circuits 507 and 508 are maintained at the level "1" to prevent any further rise in the receiving frequency. Simultaneously, in response to the discriminated output $E_D$ becoming "1", in the circuit 30 the output of NAND circuit $38_2$ becomes "0" each time the pulse $A_{14}$ becomes "1". As a result of the foregoing, the output of NAND circuit 302 becomes "1", the output of inverter 305 becomes "0", the output of NAND circuit 306 becomes "1" and the output $P_D$ of NAND circuit 309 becomes "0" intermittently at the rate determined by the pulse $A_{14}$. Therefore, downward correcting pulses $P_D$ are applied from NAND circuit 309 to counter 40 for reducing the receiving frequency to its originally established value. In other words, when the receiving frequency established in accordance with the channel identifying code read out of a selected memory unit of memory 50 results in the tuned condition for the respective channel, the receiving frequency remains pulled in to the tuned condition.

RECEIVING FREQUENCY WITHIN THE PULL-IN RANGE FOR AFT OPERATION

When the receiving frequency established in response to a channel identifying code read out of a selected memory unit in memory 50 is outside the range $f_A$ for the correct or tuned condition, but within the pull-in range of AFT circuit 120, for example, in the range $f_B$ or $f_C$ on FIG. 6F, at the time of the application of pulse $P_C$ to circuit 150, either the discriminated output $E_U$ or $E_D$ is "1" at such time and, as a result of the foregoing, the outputs $V_U$ and $V_D$ of NAND circuits 507 and 508 are maintained at the level "1" so that the circuit 150 cannot affect the receiving frequency. However, at such time, the AFT circuit 120 acts, as previously described, for varying the receiving frequency so as to bring the latter from the range $f_B$ or $f_C$ into the range $f_A$ for the correct or tuned condition. In other words, when the discriminated output $E_U$ or $E_D$ of AFT circuit 120 is "1", the output of NAND circuit $38_1$ or $38_2$ becomes "0" each time the pulse $A_{14}$ becomes "1". Accordingly, the output $P_U$ or $P_D$ of the NAND circuit 308 or 309 becomes "0" intermittently in synchronism with the pulses $A_{14}$ so that the counter 40 counts either the upward correcting pulses $P_U$ or the downward correcting pulses $P_D$ for increasing or decreasing the receiving frequency until the AFT operation results in the receiving frequency being within the correct or tuned range $f_A$, whereupon, the AFT operation is terminated by both discriminated outputs $E_U$ and $E_D$ being "0". If the number of upward or downward correcting pulses $P_U$ or $P_D$ provided by the AFT operation for bringing the receiving frequency into the correct or tuned range $f_A$ exceeds the predetermined number $n$, the normal rewriting circuit 130 operates, as previously described, to provide the rewriting instruction $P_M$ by which the digital code established by counter 40 to provide the correct or tuned condition is rewritten or stored in the selected memory unit of memory 50 in place of the channel identifying code that was originally stored therein.

RECEIVING FREQUENCY OUTSIDE THE PULL-IN RANGE FOR AFT OPERATION

If the receiving frequency established in response to a channel identifying code read out of a selected memory unit of memory 50 is only slightly outside of the pull-in range of AFT circuit 120, for example, the established frequency $f_\alpha$ is less than 100 KHz below the range $f_B$ or less than 100 KHz above the range $f_C$, as indicated on FIG. 6B, then both discriminated outputs $E_U$ and $E_D$ are "0" when the pulse $P_C$ is applied to circuit 150. As a result of the foregoing, the outputs of inverters 509 and 510 applied to NAND circuits 507 and 508 are "1" and, during the interval $T_1$, the output $V_U$ beomes "0" each time the pulse $A_{14}$ becomes "1". Each time the output $V_U$ becomes "0", the output of NAND circuit 304 becomes "1" and, as a result thereof, NAND circuit 308 applies upward correcting pulses $P_U$ to counter 40 during interval $T_1$ for increasing the receiving frequency. If such increase in the receiving frequency brings the latter into the pull-in range $f_B$, the discriminated output $E_U$ immediately becomes "1" with the result that the output $V_U$ of NAND circuit 507 is thereafter maintained at "1" so as to terminate the delivery of upward correcting pulses $P_U$ to counter 40 by the operation of circuit 150. However, when the discriminated output $E_U$ becomes "1", the previously described AFT operation commences so as to effect the continued delivery of upward correcting pulses $P_U$ to counter 40 until the receiving frequency comes into the correct or tuned condition or range $f_A$. As before, in response to the AFT operation, the normal rewriting circuit 130 becomes operative to provide the rewriting instruction $P_M$ by which the code corresponding to the correct or tuned condition is substituted or rewritten in place of the channel identifying code which resulted in the receiving frequency below the pull-in range $f_B$.

If the receiving frequency established in response to the channel identifying code read out of a selected memory unit is slightly above the pull-in range $f_C$ of AFT circuit 120 so that the increase in the receiving frequency during the interval $T_1$ does not bring the receiving frequency into the pull-in range, then both discriminated outputs $E_U$ and $E_D$ remain "0" at the conclusion of interval $T_1$. As a result of the foregoing, the outputs of inverters 509 and 510 applied to NAND circuits 507 and 508 continue to be "1" and, during the intervals $T_2$ and $T_3$, the output $V_D$ becomes "0" each time the pulse $A_{14}$ becomes "1". Each time the output $V_D$ becomes "0", the output of NAND circuit 306 becomes "1" and, as a result thereof, NAND circuit 309 applies downward correcting pulses $P_D$ to counter 40 during intervals $T_2$ and $T_3$ for decreasing the receiving frequency. If such decrease in the receiving frequency brings the latter into the pull-in range $f_C$, the discriminated output $E_D$ immediately becomes "1" with the result that the output $V_D$ of NAND circuit 508 is thereafter maintained at "1" so as to terminate the delivery of downward correcting pulses $P_D$ to counter 40 by the operation of circuit 150. However, when the discriminated output $E_D$ becomes "1", the previously described AFT operation commences so as to effect the continued delivery of downward correcting pulses $P_D$ to counter 40 until the receiving frequency comes into the correct or tuned condition or range $f_A$. As before, in response to the AFT operation, the normal rewriting circuit 130 becomes operative to provide the rewriting instruction $P_M$ by which the code corresponding to the correct or tuned condition is substituted or rewritten in place of the channel identifying code which resulted in the receiving frequency above the pull-in range $f_C$.

RECEIVING FREQUENCY FAR OUTSIDE THE PULL-IN RANGE FOR AFT OPERATION

If the receiving frequency established in response to a channel identifying code read out of a selected memory unit of memory 50 is far outside of the pull-in range of AFT circuit 120, for example, the established frequency $f_\beta$ is more than 100 KHz below the range $f_B$, as indicated on FIGS. 6C and 6D, then both discriminated outputs $E_U$ and $E_D$ are again "0" when the pulse $P_C$ is applied to circuit 150 so that the latter again operates, as described above, for varying the receiving frequency. However, in this case, neither the increasing of the receiving frequency during interval $T_1$, nor the decreasing of the receiving frequency during the intervals $T_2$ and $T_3$ are effective to bring the receiving frequency into the pull-in range of AFT circuit 120, Therefore, at the end of interval $T_3$, both discriminated outputs $E_U$ and $E_D$ remain "0" so that, during the following interval $T_4$, the output $V_U$ becomes "0" each time the pulse $A_{14}$ becomes "1". Therefore, during interval $T_4$, NAND circuit 308 applies upward correcting pulses $P_U$ to counter 40 for increasing or returning the receiving frequency to its original value $f_\beta$.

Furthermore, in the case being presently described, the outputs of NAND circuits 514 and 515 become "0" at the intervals $T_1$ and $T_3$, respectively, so as to set the flip-flops 516 and 517 at the beginning of the intervals $T_1$ and $T_3$, respectively, after such flip-flops 516 and 517 have both been reset at the front porch or rising side of the pulse $P_C$. Thus, the output $F_3$ of flip-flop 516 becomes "1" at the beginning of interval $T_1$ and the output $F_4$ becomes "1" at the beginning of interval $T_3$, with the result that the output $I_N$ of inverter 519 becomes "1" at the commencement of interval $T_3$. Since the receiving frequency is not brought into the pull-in range of AFT circuit 120 during any of the intervals $T_1$-$T_4$, the output on the output line 5 of decoder 504 becomes "0" in response to the fifth pulse $Q_0$ from oscillator 502, with the result that the output of inverter 513 becomes "1" at the end of interval $T_4$ so as to reset flip-flop 501 for stopping the oscillation of oscillator 502. When the output of inverter 513 becomes "1", monostable multivibrator 521 is triggered thereby and the output $M_4$ of such monostable multivibrator becomes "1" (FIG. 9S) for a short period. When the outputs $M_4$ and $I_N$ are both "1", the output of NAND circuit 520 is "0" and, as a result thereof, the output or signal $P_F$ (FIG. 9T) is provided by inverter 522. Therefore, circuit 150 provides the pulse or signal $P_F$ for indicating that the receiving frequency established by a channel identifying code read out of a selected memory unit is far outside of the pull-in range of AFT circuit 120 and thus cannot be brought into such pull-in range by the described operations of circuit 150.

In response to the application of the pulse or signal $P_F$ to circuit 160, the flip-flops 602 and 603 are set and the counter 604 is made operative to produce the pulses $A_{18}$-$A_{23}$ (FIGS. 10B-10G) in synchronism therewith. In response to the setting of flip-flop 602, the output $F_5$ thereof becomes "1" and, by reason of the application of such output to NAND circuit 610 along with pulses $\bar{A}_{21}$ and $\bar{A}_{22}$, the output $I_1$ (FIG. 10J) of inverter 613 becomes "1" during the interval $T_5$ which, for example, has an extent of 256 m.sec. When the output $I_1$ becomes "1", the output $S_D$ of NAND circuit 614 becomes "0" each time the pulse $A_{14}$ becomes "1". By reason of the application of the output $S_D$ to NAND circuit 306 in circuit 30, NAND circuit 309 provides downward correcting pulses $P_D$ in synchronism with the pulses $A_{14}$ during interval $T_5$ and such downward correcting pulses are counted by counter 40 for effecting a relatively large decrease in the receiving frequency, for example, a decrease of 3 MHz.

If the receiving frequency established by the read out channel identifying code is far below the pull-in range $f_B$, as indicated at $f_\beta$ on FIGS. 6C and 6D, the decrease in the receiving frequency during interval $T_5$ will obviously not be effective to bring the receiving frequency into the pull-in ragne of AFT circuit 120. Therefore, flip-flop 602 will remain in its set condition at the completion of interval $T_5$ and NAND circuits 611, 612 and 615 will cooperate to provide the output $I_2$ (FIG. 10K) of NAND circuit 615 with the value "1" during the following interval $T_6$ or until such time as the receiving frequency is brought into the correct or tuned condition $f_A$. Such interval $T_6$ has a duration twice that of the preceding interval $T_5$, for example, a duration of 512 m.sec., and, so long as output $I_2$ is "1" during interval $T_6$, the output $S_U$ of NAND circuit 616 becomes "0" each time pulse $A_{14}$ becomes "1". The application of output $S_U$ to NAND circuit 304 in circuit 30 causes NAND circuit 308 to provide upward correcting pulses $P_U$ to counter 40 so that the receiving frequency is increased by a relatively large amount, for example, by 6 MHz, during interval $T_6$.

If the receiving frequency, in the course of being increased during interval $T_6$, is brought into the pull-in range $f_B$ of AFT circuit 120, discriminated output $E_U$ of circuit 120 becomes "1" (FIG. 6E). When $E_U$ becomes "1", the output of NAND circuit $38_1$ becomes "0" each time pulse $A_{14}$ becomes "1" and, by reason of NAND circuit 301 and inverter 303, the latter applies an output of "0" to NAND circuit 304 each time the pulse $A_{14}$ becomes "1". For the remainder of interval $T_6$ or until such time as the receiving frequency is brought to the correct or tuned condition $f_A$, whichever occurs sooner, the output of inverter 303 in circuit 30 and the output $S_U$ of circuit 160 becomes "0" simultaneously each time pulse $A_{14}$ becomes "1" so as to provide an output of "1" from NAND circuit 304 and corresponding upward correcting pulses $P_U$ from NAND circuit 308 to counter 40 so that the receiving frequency continues to be increased.

If the receiving frequency has been brought into the pull-in range $f_B$ of AFT circuit 120 during interval $T_6$ but such interval is concluded prior to the time when the receiving frequency has been increased sufficiently so as to be within the correct or tuned condition $f_A$, for example, as illustrated on FIG. 6D, then, at the conclusion of interval $T_6$, output $I_2$ of NAND circuit 615 returns to "0" in response to the states of the pulses $\overline{A}_{21}$ and $A_{22}$ and the pulses $A_{21}$ and $\overline{A}_{22}$ applied to NAND circuits 611 and 612. As a result of the foregoing, output $S_U$ circuit 160 is maintained at "1" following the conclusion of interval $T_6$, and, thereafter, the receiving frequency is further increased by reason of the fact that discriminated output $E_U$ of AFT circuit 120, as applied to NAND circuit $38_1$ in circuit 30, is maintained at "1" until the receiving frequency attains the tuned or correct condition $f_A$.

By reason of the pulses $\overline{A}_{18}$, $\overline{A}_{19}$, $\overline{A}_{20}$, $A_{21}$ and $A_{22}$ applied to NAND circuit 628, the output $I_8$ of the latter (FIG. 10R) is maintained at "1" during intervals $T_5$ and $T_6$ and is changed-over to "0" for one pulse $\overline{A}_{18}$ at the completion of interval $T_6$. Further, by reason of the pulses $\overline{A}_{18}$, $\overline{A}_{19}$, $\overline{A}_{20}$, $A_{21}$, $\overline{A}_{22}$ and $A_{23}$ applied to NAND circuit 631, the output $I_9$ of the latter (FIG. 10U) is maintained at "1" during intervals $T_5$ and $T_6$ and during two succeeding intervals $T_7$ and $T_8$ each equal in duration to interval $T_5$, and output $I_9$ is changed-over to "0" for one pulse $\overline{A}_{18}$ at the completion of interval $T_8$.

In the initial or starting condition of circuit 160, that is, when pulse $P_F$ is received thereby, and thereafter until the receiving frequency is brought into pull-in range $f_B$, during which times $E_D$ and $E_U$ are both "0" and either $I_1$ or $I_2$ is "1", the outputs of NAND circuits 617, 618 and 632 are "1" so that the output $I_4$ of NAND circuit 619 is maintained at "0". So long as output $I_4$ is "0", the output $I_5$ of NAND circuit 620 is "1" and the output $\overline{I}_5$ of inverter 623 is "0". However, when the receiving frequency is brought into pull-in range $f_B$, for example, during interval $T_6$ so that discriminated output $E_U$ becomes "1", the output $I_3$ of NAND circuit 618 becomes "0"and, accordingly, the output $T_4$ of NAND circuit 617 becomes "1". Since the output $I_9$ of NAND circuit 631 is "1" (FIG. 10U), the change-over of output $I_4$ from "0" to "1" during interval $T_6$ causes the output of NAND circuit 632 to become "0" for maintaining the output $I_4$ at "0" until the subsequent resetting of the circuit when output $I_9$ becomes "0" at the end of interval $T_8$.

When the receiving frequency attains the correct or tuned condition $f_A$, that is, when $E_U$ returns to "0" to halt further increasing of the receiving frequency by AFT circuit 120, the outputs of inverters 621 and 622, as well as output $I_4$ are "1" so that the output $I_5$ of NAND circuit 620 becomes "0" and the output $\overline{I}_5$ of inverter 623 becomes "1", thereby detecting the correct or tuned condition.

So long as flip-flop 602 is in its set condition, the rewriting inhibit output $F_M$ therefrom has the value "0" (FIG. 10I). Such output $F_M$, being applied to NAND circuit 137 (FIG. 1), ensures that the output of the latter will be maintained at "1" even though pulses $P_U$ or $P_D$ are applied to NAND circuit 136 in the course of the changing of the receiving frequency by the described operation of circuit 160. Thus, the counting of such pulses $P_U$ or $P_D$ by counter 134 will be prevented so long as $F_M$ is "0".

The flip-flop 602 is reset when the output of inverter 629 becomes "0", that is, when output $I_7$ (FIG. 10Q) of NAND circuit 627 is changed-over to "1" from "0", either in response to detection of the correct or tuned condition $f_A$ of the receiving frequency or at the end of interval $T_6$. Thus, if the correct or tuned condition is detected, that is, $\overline{I}_5$ becomes "1", prior to the end of interval $T_6$, as shown on FIG. 10-0, at which time $I_2$ and $I_8$ are still "1", the output $I_6$ (FIG. 10P) of NAND circuit 625 becomes "0" to change-over output $I_7$ to "1". On the other hand, if interval $T_6$ ends prior to detection of the tuned or correct condition $f_A$ of the receiving frequency, or even prior to bringing the receiving frequency into the pull-in range of AFT circuit 120, the change-over of output $I_8$ of NAND circuit 628 to "0" at the end of interval $T_6$ is effective to change-over the output of NAND circuit 627 to "1" for resetting flip-flop 602 no matter what the states may be of the outputs of NAND circuits 624 and 625 at that time. The resetting of flip-flop 602 changes its output $F_5$ to "0" and its output $F_M$ to "1" (FIGS. 10H and 10I).

When the tuned or correct condition $f_A$ of the receiving frequency is detected, that is, when output $\overline{I}_5$ of inverter 623 becomes "1", the application of that output $\bar{I}_5$ to NAND circuit 630 causes the output $P_N$ (FIG. 10T) of the latter to become "0" in the interval $T_8$. When such output $P_N$ is applied to NAND circuit 65 of the memory control 60, the effect thereof is to cause the rewriting, in the selected memory unit of memory 50, of the channel identifying code then established by counter 40 for providing the correct or tuned condition $f_A$ in place of the code previously read out of such memory unit to provide the erroneous receiving frequency $f_\beta$.

It will be noted that the rewriting instruction, that is, $P_N = 0$, requires that the correct or tuned condition $f_A$ has been detected, and further is delayed by the interval $T_7$ from the end of the upward sweeping of the receiving frequency in the interval $T_6$. Therefore, if, for example, the large sweeping changes of the receiving frequency by the operation of circuit 160 have not been sufficient to even bring the receiving frequency into the pull-in range of AFT circuit 120, then the rewriting instruction $P_N$ will not be provided by NAND circuit 630. Furthermore, if the pulses $S_U$ from circuit 160 during interval $T_6$ have only been effective to bring the receiving frequency into the pull-in range $f_B$ of AFT circuit 120 so that the latter continues to operate after the conclusion of interval $T_6$ for bringing the receiving frequency to the correct or tuned condition $f_A$, the delay interval $T_7$ ensures that sufficient time will be provided for such AFT operation prior to the issuance of the rewriting instruction $P_N$.

In all cases, at the end of the rewriting interval $T_8$, during which $P_N$ is "0", the output $I_9$ of NAND circuit 631 becomes "0" for resetting flip-flop 603. Further, when $I_9$ becomes "0", the output of NAND circuit 632 is returned to "1" with the result that output $I_4$ of NAND circuit 619 is restored to "0". When output $I_4$ becomes "0", output $I_5$ of NAND circuit 620 becomes "1" and output $\bar{I}_5$ becomes "0", that is, all of the components of circuit 160 are restored to their starting or initial conditions.

In the above description of operation of circuit 160, it has been assumed that the receiving frequency $f_\beta$ established by the code read out of a selected memory unit is far below the pull-in range $f_B$ of AFT circuit 120 so that the receiving frequency may be brought into such pull-in range during the interval $T_6$, that is, when the circuit 160 functions to increase the receiving frequency. However, it will be apparent that the circuit 160 may function similarly when the originally established receiving frequency $f_\beta$ is far above the pull-in range $f_C$. In the latter case, the receiving frequency is brought into the pull-in range $f_C$ while being decreased during the interval $T_5$. When the receiving frequency enters pull-in range $f_C$, discriminated output $E_D$ becomes "1" to cause the change-over of output $I_4$ from "0" to "1" so that, when the tuned condition $f_A$ is achieved, that is, $E_D$ returns to "0", output $\bar{I}_5$ becomes "1". When output $\bar{I}_5$ becomes "1", that is, when the tuned condition is detected during interval $T_5$, the output of NAND circuit 624 becomes "0" to change-over output $I_7$ from "0" to "1" and thereby effect resetting of flip-flop 602. When flip-flop 602 is thus reset, its output $F_5$ becomes "0" so that neither $I_1$ nor $I_2$ can be "1" with the result that $S_D$ and $S_U$ are thereafter maintained at "1". Accordingly, after the tuned condition $f_A$ is attained during interval $T_5$, the circuit 160 no longer operates to further decrease the receiving frequency during the remainder of interval $T_5$ or to thereafter increase the receiving frequency during the interval $T_6$. Furthermore, when the correct or tuned condition $f_A$ is attained in response to the decreasing of the receiving frequency by circuit 160 during the interval $T_5$, the application of $\bar{I}_5 = 1$ to NAND circuit 630, that is, the detection of the tuned condition, causes the rewriting instruction $P_N$ to become "0" in the interval $T_8$ and, thereafter, the output $I_9$ of NAND circuit 631 becomes "0" for resetting flip-flop 603 and for restoring $I_4$ and $\bar{I}_5$ to "0", that is, for returning circuit 160 to its original condition.

In the event that the decreasing of the receiving frequency during the interval $T_5$ only brings the receiving frequency into the pull-in range $f_C$, that is, the interval $T_5$ is concluded prior to the attainment of the correct or tuned condition $f_A$, then, at such conclusion of interval $T_5$, $I_1$ becomes "0" and $I_2$ becomes "1". Therefore, during the following interval $T_6$, pulses $S_U$ are applied from circuit 160 to NAND circuit 304 so that upward correcting pulses $P_U$ issue from NAND circuit 308. However, during such interval $T_6$, the discriminated output $E_D$ from AFT circuit 120 is "1" so that the output of NAND circuit $38_2$ is "0" each time pulse $A_{14}$ is "1" with the result that downward correcting pulses $P_D$ issue from NAND circuit 309 simultaneously with the upward correcting pulses $P_U$ from NAND circuit 308. Since counter 40 does not count simultaneously received upward and downward correcting pulses $P_U$ and $P_D$, the receiving frequency remains unchanged at a value just within pull-in range $f_c$ for the duration of interval $T_6$. At the conclusion of the interval $T_6$, output $I_2$ of NAND circuit 615 returns to "0", as previously described, and, as a result thereof, output $S_U$ of circuit 160 thereafter maintained at "1". Further, at the conclusion of the interval $T_6$, the receiving frequency is still just within the pull-in range $f_C$ so that discriminated output $E_D$ is maintained at "1" to cause downward correcting pulses $P_D$ to be counted by counter 40 until the resulting receiving frequency attains the correct or tuned condition $f_A$ at which output $E_D$ returns to "0".

Of course, if it is desired to avoid the application of upward and downward correcting pulses $P_U$ and $P_D$ simultaneously to counter 40, as described above with reference to the interval $T_6$, it would only be required to interpose gate circuits (not shown) between NAND circuits 304 and 308 and between NAND circuits 306 and 309, with each of such gate circuits permitting the passage of a pulse from the respective NAND circuit 304 or 306 only in the absence of a simultaneously occurring pulse from the other NAND circuit 306 or 304, respectively.

It will be noted that, in the above described embodiment of the invention, the AFT circuit 120 is effective to attain the correct or tuned condition $f_A$ of the receiving frequency within the pull-in range $f_B$ or $f_C$ of the AFT circuit. If the change in the receiving frequency effected by AFT circuit 120 for attaining the correct or tuned condition $f_A$ exceeds a predetermined amount, the normal memory rewriting or refreshing circuit 130 is operative to cause the rewriting of the code established by counter 40 for the correct or tuned condition in place of the channel identifying code that was read out from the selected memory unit. Thus, if each memory unit or address of memory 50 is regularly selected for reception of the channel programmed therein, it is likely that, upon each selection of a particular channel, the receiving frequency established in response to the respective channel identifying code read out of the memory will provide either the correct or tuned condition or at least be within the pull-in range $f_B$ or $f_C$ of the AFT circuit 120.

However, if a particular channel is only infrequently selected so that the receiving frequency established by the respective read out channel identifying code may be outside the pull-in range $f_B$ or $f_C$ of AFT circuit 120 by a relatively small amount, for example, as at $f_\alpha$ on FIG. 6B, the circuit 150 is operative to effect sweeping changes in the code from counter 40 for cyclically varying the receiving frequency and thereby bringing the latter into the pull-in range of AFT circuit 120 so that the latter then operates to attain the tuned condition and the circuit 130 causes the rewriting of the code corresponding to the tuned condition in place of the code which was read out of the memory. Moreover, if a long period elapses between successive selection of a particular channel so that the receiving frequency established by the respective read out channel identifying code is far outside the pull-in range of AFT circuit 120, as at $f_\beta$ on FIGS. 6B and 6C, and cannot be brought into the pull-in range by circuit 150, then circuit 150 detects that fact and causes operation of circuit 160 for effecting large sweeping changes in the code from counter 40 and corresponding cyclical variations in the receiving frequency by which the latter is brought to the tuned condition, or at least to within the pull-in range of the AFT circuit. Following the attainment of the tuned condition of the receiving frequency, the circuit 160 causes the corresponding modified code from counter 40 to be rewritten in the selected memory unit in place of the channel identifying code that produced the receiving frequency $f_\beta$.

From the above, it will be seen that the channel selecting apparatus according to this invention is effective to achieve the correct tuned condition upon each selection of a channel previously programmed in memory 50 whether or not such channel is regularly or only infrequently selected.

In the illustrated embodiment, the circuit 150 is automatically actuated by the pulse or signal $P_C$ following the initial connection of the channel selecting apparatus to a power source and following each operation of circuit 70 for selecting a channel. However, if desired, the pulse or signal $P_C$ for initiating operation of circuit 150 may be obtained by a manual actuation of a switch or the like when the operator of the television receiver has ascertained visually that the AFT operation of circuit 120 has not been sufficient to attain the tuned condition.

Further, if desired, the circuit 130 for effecting the normal rewriting or refreshing of memory 50 upon operation of AFT circuit 120 may be omitted, in which case the rewriting or refreshing operation is performed in response to the pulse $P_N$ from circuit 160 only when the receiving frequency established by a code read out of memory 50 is far outside the pull-in range of AFT circuit 120.

Finally, it will be apparent that, in the illustrated embodiment of the invention, the circuit 150 is operative for cyclically increasing the then decreasing the receiving frequency by, for example, 100 KHz, in respect to the receiving frequency established by a read out code, and that the circuit 160 becomes operative to cyclically vary the receiving frequency by, for example, 3 MHz, below and above the frequency established by the read out code only if the ± 100 KHz change in receiving frequency does not bring the latter into the pull-in range of the AFT circuit 120. Therefore, the large cyclical changes in the receiving frequency, for example, by ± 3 MHz, which cause substantial disturbance in the television picture are effected only in exceptional cases; whereas, the more frequently occurring relatively smaller cyclical changes in the receiving frequency, for example, by ± 100 KHz, do not cause substantial disturbance in the television picture. However, if disturbance of the television picture immediately after selection of a channel is not considered onerous, the circuit 150 may be arranged to provide relatively large cyclical changes in the receiving frequency, for example, of about ± 3 MHz, so as to ensure that all receiving frequencies are brought into the pull-in range of AFT circuit 120, and the additional circuit 160 may then be omitted.

Although an illustrative embodiment of the invention and specific modifications thereof have been described in detail herein with reference to the accompanying drawings, it is to be understood that the invention is not limited to that precise embodiment or the described modifications, and that various changes and further modifications may be effected therein by one skilled in the art without departing from the scope or spirit of the invention as defined in the appended claims.

What is claimed is:

1. A channel selecting apparatus for a television receiver having an electronic tuning tuner for determining the receiving frequency in accordance with an analog control signal applied thereto; said channel selecting apparatus comprising memory means having a plurality of addresses for storing respective digital codes each identifying a respective channel, addressing means actuable for selectively activating each of said addresses in the memory means so as to effect read out of the respective channel identifying digital code, digital-to-analog converting means for converting the digital code being read out of said memory means into a respective analog control signal for said tuner, means for detecting deviation of the receiving frequency, as established in response to said analog control signal, from the correct receiving frequency for the channel identified by the digital code then being read out of said memory means, automatic fine tuning means having predetermined pull-in ranges and being responsive to a detected deviation of said established receiving frequency from said correct receiving frequency within said pull-in ranges for modifying the channel identifying digital code being converted by said converting means in the sense for removing said deviation and thereby attaining said correct receiving frequency, and means operative, when said detected deviation is outside said pull-in ranges, to effect sweeping changes of the channel identifying code being converted by said converting means for cyclically varying said receiving frequency and thereby bringing the latter at least into one of said pull-in ranges of the automatic fine tuning means.

2. A channel selecting apparatus according to claim 1; further comprising means operative, when said deviation exceeds a predetermined amount, to store the resulting modified digital code for said correct receiving frequency in said memory means in place of the read out digital code resulting in said deviation.

3. A channel selecting apparatus according to claim 1; in which said means operative to effect sweeping changes of the channel indentifying code being converted by said converting means includes means to effect first relatively small sweeping changes in said channel identifying code, and means operative, only when said first relatively small sweeping changes fail to bring said receiving frequency into one of said pull-in ranges, to effect second relatively large sweeping changes in said channel identifying code.

4. A channel selecting apparatus according to claim 3; further comprising means operative, when said deviation exceeds a predetermined amount, to store the resulting modified digital code for said correct receiving frequency in said memory means in place of the read out digital code resulting in said deviation.

5. A channel selecting apparatus according to claim 1; further comprising sweep pulse generating means for generating sweep pulses, counting means for counting said sweep pulses and providing said digital codes in correspondence with the changing count of said counting means, and means for writing selected digital codes from said counting means at selected addresses in said memory means; and in which said automatic fine tuning means includes means for causing said sweep pulse generating means to produce correction pulses counted by said counting means for changing the count of the latter and thereby modifying the channel identifying digital code converted by said digital-to-analog converting means for attaining said correct receiving frequency.

6. A channel selecting apparatus according to claim 5; in which said means operative to effect sweeping changes of the channel identifying code being converted by said converting means includes means for causing said sweep pulse generating means to produce correction pulses counted by said counting means in one direction for a first predetermined interval and then in the opposite direction for a second relatively longer interval.

7. A channel selecting apparatus according to claim 6; in which said means for writing the digital codes at said selected addresses in the memory means includes memory control means selectively disposable in a programming mode and a channel selecting mode, and write control means operable, when said memory control means is in said programming mode, to cause writing at said address in said memory means then activated by said addressing means of the digital code being received from said counting means; and in which said memory control means, when in said channel selecting mode, initially adapts the count of said counting means to the channel identifying digital code being read out from the address in said memory means which is then activated by said addressing means.

8. A channel selecting apparatus according to claim 7; further comprising rewriting means operative in said channel selecting mode, when said deviation exceeds a predetermined amount, to rewrite, at the address in said memory means then activated by said addressing means, the modified digital code corresponding to said correct receiving frequency in place of said channel identifying digital code being read out from said activated address.

9. A channel selecting apparatus according to claim 8; further comprising inhibit means operative upon actuation of said addressing means for delaying, for a predetermined time thereafter, any production of said correction pulses.

10. A channel selecting apparatus according to claim 8; in which said rewriting means includes second counting means for counting said correction pulses applied to the first mentioned counting means, and means for providing a rewrite instruction signal to said memory control means when the correction pulses counted by said second counting means exceed a predetermined number.

11. A channel selecting apparatus according to claim 5; in which said automatic fine tuning means includes means for producing first and second discriminated outputs when said established receiving frequency is in said pull-in ranges above and below, respectively, said correct receiving frequency, and means for causing said sweep pulse generating means to produce said correction pulses to be counted down and up, respectively, by said counting means in response to said first and second discriminated outputs, respectively.

12. A channel selecting apparatus according to claim 11; in which said means operative to effect sweeping changes of the channel identifying code being converted by said converting means includes means operative only so long as both of said discriminated outputs are absent for causing said sweep pulse generating means to produce correction pulses counted by said counting means in one direction for a first interval, then in the opposite direction for a second interval approximately twice said first interval, and then again in said one direction for a third interval equal to said first interverval.

13. A channel selecting apparatus according to claim 12; in which said means operative to effect sweeping changes of the channel identifying code being converted by said converting means further includes means made operative at the end of said third interval, in the event that one of said discriminated outputs does not occur during one of said first and second intervals, for causing said sweep pulse generating means to produce correcting pulses counted by said counting means in one direction for a fourth interval longer than any of said first through third intervals and in the opposite direction for a fifth interval approximately twice the length of said fourth interval, and means for halting the production of said correcting pulses during either of said fourth and fifth intervals upon the attainment of said correct receiving frequency.

14. A channel selecting apparatus according to claim 13; in which said means for writing the digital codes at said selected address in the memory means includes memory control means selectively disposable in a programming mode and a channel selecting mode, and write control means operable, when said memory control means is in said programming mode, to cause writing at said address in said memory means when activated by said addressing means of the digital code being received from said counting means; and in which said memory control means, when in said channel selecting mode, initially adapts the count of said counting means to the channel identifying digital code being read out from the address in said memory means which is then activated by said addressing means.

15. A channel selecting apparatus according to claim 14; further comprising rewriting means operative in said channel selecting mode, when said deviation exceeds a predetermined amount, to rewrite, at the address in said memory means then activated by said addressing means, the modified digital code corresponding to said correct receiving frequency in place of said channel identifying digital code which was read out from said activated address.

16. A channel selecting apparatus according to claim 15; in which said rewriting means includes rewrite instructing means made operative when one of said discriminated outputs occurs for providing a rewrite instruction signal to said memory control means in the event that, following the occurrence of said one discriminated output, at least a predetermined number of said correction pulses are produced by said sweep pulse generating means.

17. A channel selecting apparatus according to claim 16; further comprising means inhibiting the operation of said rewrite instructing means during said fourth and fifth intervals, and second rewrite instructing means made operative upon the attainment of said correct receiving frequency during either one of said fourth and fifth intervals for providing an alternative rewrite instruction signal to said memory control means following the completion of said fifth interval.

* * * * *